(12) United States Patent
Nishi et al.

(10) Patent No.: US 7,642,604 B2
(45) Date of Patent: Jan. 5, 2010

(54) SEMICONDUCTOR DEVICE AND FABRICATION METHOD OF SAME

(75) Inventors: Yoshifumi Nishi, Kanagawa (JP); Takashi Yamauchi, Kanagawa (JP); Yoshinori Tsuchiya, Kanagawa (JP); Junji Koga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/036,703

(22) Filed: Feb. 25, 2008

(65) Prior Publication Data

US 2008/0230804 A1 Sep. 25, 2008

(30) Foreign Application Priority Data

Mar. 22, 2007 (JP) ............................. 2007-073839

(51) Int. Cl.
*H01L 23/48* (2006.01)
(52) U.S. Cl. .................. 257/368; 257/377; 257/382; 257/384; 257/774; 257/E21.632
(58) Field of Classification Search ............ 257/412, 257/413, 476, 774, E21.632, E21.159, 368, 257/377, 382, 384
See application file for complete search history.

(56) References Cited

U.S. PATENT DOCUMENTS 5,177,568 A * 1/1993 Honma et al. ............... 257/295
5,719,083 A 2/1998 Komatsu
6,972,470 B2 12/2005 Irwin et al.
2006/0038229 A1 * 2/2006 Tsuchiya et al. ............ 257/351

FOREIGN PATENT DOCUMENTS

JP 2005-123626 5/2005

OTHER PUBLICATIONS

S.S. Lau et al. "Surface Morphology of erbium silicide", Appl. Phys. Lett., 41(1), Jul. 1, 1982 pp. 77-80.

* cited by examiner

*Primary Examiner*—Tan N Tran
(74) *Attorney, Agent, or Firm*—Oblon, Spivak, McClelland, Maier & Neustadt, L.L.P.

(57) ABSTRACT

A semiconductor device having an electrode with reduced electrical contact resistance even where either electrons or holes are majority carriers is disclosed. This device has an n-type diffusion layer and a p-type diffusion layer in a top surface of a semiconductor substrate. The device also has first and second metal wires patterned to overlie the n-type and p-type diffusion layers, respectively, with a dielectric layer interposed therebetween, a first contact electrode for electrical connection between the n-type diffusion layer and the first metal wire, and a second contact electrode for connection between the p-type diffusion layer and the second metal wire. The first contact electrode's portion in contact with the n-type diffusion layer and the second contact electrode's portion contacted with the p-type diffusion layer are each formed of a first conductor that contains a metal and a second conductor containing a rare earth metal.

3 Claims, 17 Drawing Sheets

| Silicide | Schottky Barrier Height for Electrons (eV) | Schottky Barrier Height for Holes (eV) |
|---|---|---|
| $TiSi_2$ | 0.60 | 0.50 |
| $CoSi_2$ | 0.64 | 0.46 |
| NiSi | 0.65 | 0.45 |
| $WSi_2$ | 0.65 | 0.45 |
| PtSi | 0.88 | 0.22 |
| $ErSi_2$ | 0.39 | 0.71 |
| $YSi_{1.7}$ | 0.39 | 0.71 |

*1

*3

SEMICONDUCTOR DEVICE AND FABRICATION METHOD OF SAME

CROSS-REFERENCE TO RELATED APPLICATION

This application is based upon and claims the benefit of priority from Japanese Patent Application No. 2007-73839, filed on Mar. 22, 2007, the entire contents of which is incorporated herein by reference.

FIELD OF THE INVENTION

The present invention relates generally to semiconductor device microfabrication technologies and, more particularly, to a semiconductor device having improved electrodes to be formed on or above a semiconductor substrate. This invention also relates to a method of fabricating the device.

BACKGROUND OF THE INVENTION

For performance enhancement of semiconductor large-scale integrated (LSI) circuits, it is indispensable to improve performances of field effect transistors (FETs) which are for use as basic on-chip circuit device. Until today, the circuit-device performance improvement has been progressed by miniaturization, i.e., onchip device scaling.

As FETs become shorter in channel length due to the miniaturization, the electrical resistance of a channel decreases. Accordingly, the resistance of portions other than the channel such as source and drain electrodes, known as the parasitic resistance, exerts a great influence on the performance of circuit elements. Thus, in order to achieve further miniaturization, it is a must to reduce the parasitic resistance. For example, in FETs which are formed on a bulk silicon (Si), about the half of a parasitic resistance component arises from electrical contact resistance at a contact portion between Si and an electrode metal. Therefore, reducing the contact resistance is an effective means in order to reduce the parasitic resistance. A problem similar to that of the source/drain electrodes in FETs occurs for highly miniaturized contact electrodes also.

At the interface between electrode metal and semiconductor, e.g., Si, what is called the Schottky barrier takes place. This becomes the origin of electrical contact resistance. To reduce the contact resistance, two approaches are currently available which follow.

The first approach is to increase the impurity concentration near the interface on the silicon side. By increasing the impurity concentration, the width of a depletion layer becomes smaller, resulting in the Schottky barrier being thinned. Thus, the effective Schottky barrier is reduced by the so-called mirror image effect thus induced. However, it is theoretically incapable of increasing the activation impurity concentration to the extent that it is greater than a limit of solid solubility. Further, the density of a practically activatable impurity stays lower than the solid solubility limit, and therefore this method is considered to have its limits.

The second approach is to use Schottky barrier height-lowered material as the electrode metal material. The Schottky barrier for electrons at an interface between Si and nickel mono-silicide (NiSi), which is considered to be one of next-generation electrode materials, has a relatively high value of 0.65 electron-volts (eV). When platinum (Pt) is added in order to increase the thermal immunity of NiSi, the Schottky barrier for electrons becomes much higher. On the contrary, if the electrode metal material is replaced by silicides of a rare earth metal, e.g., erbium (Er) or else, the Schottky barrier for electrons decreases to about 0.4 eV. According to generally known Schottky barrier theories, an electrical current flowing in Schottky barrier varies exponentially with respect to the height of Schottky barrier. Accordingly, lowering the Schottky barrier height results in significant improvement of electrical contact resistance between the electrode and semiconductor.

From a viewpoint of the second method, advances are presently made in studies of a new metal silicide material in place of the NiSi. In particular, for n-channel type metal insulator semiconductor field effect transistors (nMISFETs), rare earth metal silicides have attracted much attention, which are inherently low in Schottky barrier height with respect to electrons.

However, the advantage of lowering the Schottky barrier height in nMISFETs does not come without accompanying a penalty: an increase in Schottky barrier height for holes in p-type MISFETs. In order to avoid this risk, a need is felt to use for pMISFETs a different kind of electrode material from that for nMISFETs, such as NiSi, Pt-added NiSi or PtSi, which is extra-low in Schottky barrier for holes. This is known as the "dual silicide" structure.

In contrast, in order to adjust a voltage drop (Vf) of Schottky diode in the forward direction, a technique is known which uses for an electrode two kinds of metals that are different in Vf characteristics from each other. An example of it is disclosed in U.S. Pat. No. 6,972,470 B2.

Additionally, it has been reported that the interface with silicon can decrease in morphology in cases where erbium silicide (ErSi) is used for electrodes. Regarding this phenomenon, detailed teachings are found, for example, in S. S. Lau et al., "Surface morphology of erbium silicide," Applied Physics Letter 41(1), pp. 77-80 (1982).

As previously stated, in order to reduce electrical contact resistance at the source and drain electrodes of an nMISFET, it is desirable to use specific electrode material which is less in Schottky barrier with respect to electrons serving as majority carriers of the nMISFET. On the contrary, to reduce contact resistance at the source and drain electrodes of a pMISFET, it is needed to use another electrode material that is less in Schottky barrier for holes acting as the carriers of such pMISFET. When an attempt is made to use such different electrode materials for nMISFET and pMISFET, a need arises for separately forming, by different processes, the electrodes for nMISFET and those for pMISFET. This poses a problem as to an increase in process complexity. A similar problem also occurs when forming on a semiconductor device both a contact electrode associated with an n-type diffusion layer which uses electrons as its majority carriers and a contact electrode with a p-type diffusion layer which uses holes as its carriers.

SUMMARY OF THE INVENTION

It is therefore an object of this invention to provide a semiconductor device having electrodes which are formed using in combination a material that is low in contact resistance for electrons and another material low in contact resistance for holes whereby the contact electrode resistance is kept lowered even when either electrons or holes are used as majority carriers, and also to provide a fabrication method of the device.

In accordance with one aspect of this invention, a semiconductor device is provided, which includes a semiconductor substrate having a surface with an n-type diffusion layer and a p-type diffusion layer being formed therein, a first metal wire patterned to overly the n-type diffusion layer with a dielectric layer being interposed therebetween, and a second metal wire over the p-type diffusion layer with the dielectric layer interposed therebetween. The device also includes a first contact electrode which is provided in a through-going hole of the dielectric layer for electrical connection between the n-type diffusion layer and the first metal wire, and a second contact electrode which is provided in a through-hole of the dielectric layer for electrical connection between the p-type diffusion layer and the second metal wire. The first contact electrode has a portion in contact with the n-type diffusion layer. The second contact electrode has its portion contacted with the p-type diffusion layer. Each of these contact portions is formed of a first conductive material containing a metal and a second conductive material containing a rare earth metal.

In accordance with another aspect of the invention, a semiconductor device includes a semiconductor substrate having in its surface a first semiconductor region and a second semiconductor region, an n-type metal insulator semiconductor field effect transistor (nMISFET) in the first semiconductor region, and a p-type MISFET (pMISFET) in the second semiconductor region. The nMISFET has a pair of spaced-apart semiconductor source and drain regions formed in the first semiconductor region and a couple of source and drain electrodes overlying the source and drain regions. The pMISFET has a pair of semiconductor source and drain regions formed in the second semiconductor region and a couple of source and drain electrodes overlying the source and drain regions of the pMISFET. The source and drain electrodes of the nMISFET have first portions contacted with the source and drain regions of the nMISFET. The source and drain electrodes of the pMISFET have second portions contacted with the source and drain regions of the pMISFET. Each of the first and second portions is formed of a first conductive material which contains a metal and a second conductive material that contains a rare earth metal.

In accordance with a further aspect of the invention, a method of fabricating a semiconductor device is provided, which includes the steps of forming an n-type diffusion layer and a p-type diffusion layer in a surface of a semiconductor substrate, forming on the surface of the substrate a dielectric layer to cover the n-type and p-type diffusion layers, defining in the dielectric layer a first contact hole permitting exposure of a surface portion of the n-type diffusion layer therethrough and a second contact hole permitting exposure of a surface portion of the p-type diffusion layer therethrough, depositing a first metal film on the exposed surface portions of the n-type and p-type diffusion layers, performing first-time thermal processing to cause the first metal film to react with the n-type and p-type diffusion layers to thereby form a first metal semiconductor compound, depositing on the first metal semiconductor compound a second metal film which contains a rare earth metal, performing second-time thermal processing to cause the second metal film to react with the first metal semiconductor compound to thereby form a second metal semiconductor compound while substantially simultaneously causing a metal in the first metal semiconductor compound to react with the n-type diffusion layer and the p-type diffusion layer to thereby form a third metal semiconductor compound, forming a first metal wire in an area of the dielectric layer including the first contact hole, and forming a second metal wire in an area of the dielectric layer including the second contact hole.

In accordance with another further aspect of the invention, a method of fabricating a semiconductor device having on a semiconductor substrate an nMISFET and a pMISFET is provided. This method includes the steps of forming above the substrate a gate electrode of the nMISFET and a gate electrode of the pMISFET with a gate insulator film being interposed between the substrate and the gate electrodes, forming a sidewall insulator film on both side faces of each gate electrode, depositing a first metal film on selected surface portions of the substrate for later use as source and drain electrodes of the nMISFET and the pMISFET, performing first-time thermal processing to cause the first metal film to react with the substrate to thereby form a first metal semiconductor compound, depositing on the first metal semiconductor compound a second metal film which contains a rare earth metal, and performing second-time thermal processing to cause the second metal film to react with the first metal semiconductor compound to thereby form a second metal semiconductor compound while causing a metal in the first metal semiconductor compound to react with the substrate to thereby form a third metal semiconductor compound.

According to the present invention, the source/drain electrodes are each formed of a combination of a low contact resistance material in the case of majority carriers of electrons and a high contact resistance material in the case of majority carriers of holes so that it becomes possible to provide the intended semiconductor device having contact resistance-lowered electrodes even in the case where either electrons or holes are the carriers and also to provide the fabrication method thereof.

DETAILED DESCRIPTION OF THE EMBODIMENTS

Figures 1, 2:
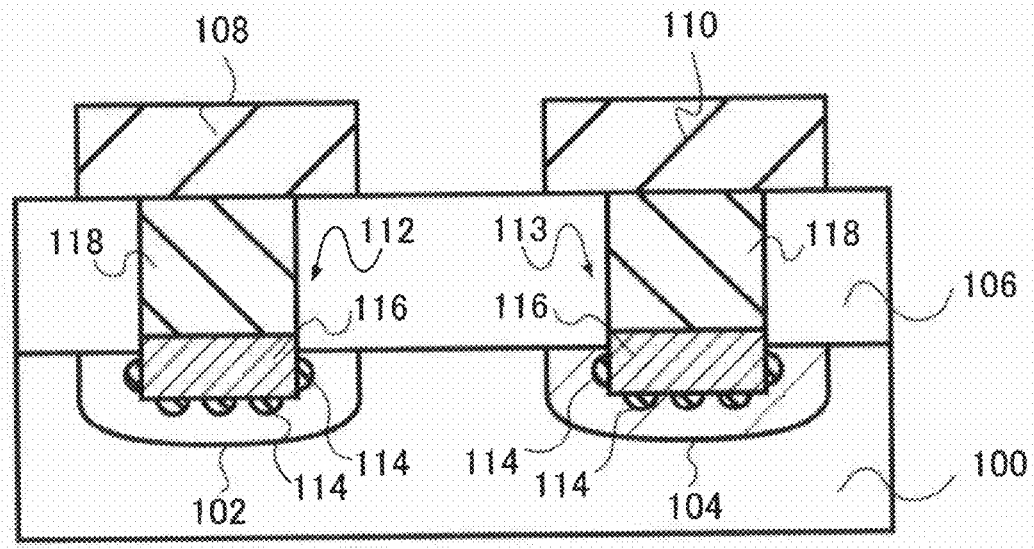
FIG. 1 is a diagram showing a cross-sectional view of a device structure of a semiconductor device in accordance with one embodiment of this invention.
FIG. 2 shows, in table form, Schottky barrier height values of silicides with respect to silicon, which silicides are usually for use in the manufacture of semiconductor devices.

Several embodiments of this invention will be explained with reference to the accompanying figures of the drawing below.

In the description, the term "metal semiconductor compound" refers to a material formed by chemical union of a metal and a semiconductor. Examples of such compound include metal silicides of a metal and silicon (Si) and also metal-silicon germanides formed by combination of a metal, Si, and germanium (Ge). Additionally, the term "source semiconductor region" or "drain semiconductor region" will be used in the description to mean a semiconductive part in close proximity to a portion at which is formed the source or drain structure of a metal insulator semiconductor field effect transistor (MISFET), the semiconductive part having a portion that is in contact with a source electrode or a drain electrode. Each region is not always the one that has a distinct boundary with either a well region or a semiconductor portion of a semiconductor substrate and that is distinguishable therefrom.

First Embodiment

A semiconductor device of a first embodiment of this invention has an n-type diffusion layer and a p-type diffusion layer in a top surface of a semiconductor substrate. The device includes first and second metal wires which are formed to overlie these n-type and p-type diffusion layers, respectively, with a dielectric layer being interposed therebetween, a first contact electrode which is provided in an opening or "viahole" defined in the dielectric layer to electrically connect the n-type diffusion layer and the first wire together, and a second contact electrode which is provided in another hole in the dielectric layer to electrically connect the p-type diffusion layer and the second wire together. Furthermore, a portion of the first contact electrode which is contacted with the n-type diffusion layer and a portion of the second contact electrode which is contacted with the p-type diffusion layer are arranged so that each portion is formed of a first conductor (conductive material) that contains therein a chosen metal and a second conductor (conductive material) that contains a rare earth metal.

FIG. 1 is a sectional diagram showing an integrated circuit element structure of a semiconductor device in accordance with the first embodiment of the invention. A semiconductor substrate 100 is made of p-type silicon that contains boron (B) as an impurity and has a top surface, in which are formed an n-type diffusion layer 102 with either arsenic (As) or phosphorus (P) as its impurity and a p-type diffusion layer 104 with boron (B) as its impurity. On the semiconductor substrate 100 including the n-type diffusion layer 102 and p-type diffusion layer 104, a dielectric film 106 is formed, which is made of silicon oxide. On this dielectric film 106, a first metal wiring line 108 and second metal wiring line 110 are formed, which are made of aluminum (Al) or copper (Cu) or else. The device structure has a first contact electrode 112 for electrically connecting together the n-type diffusion layer 102 and the first metal wire 108, and a second contact electrode 113 for electrical connection between the p-type diffusion layer 104 and the second metal wire 110. Note here that the first contact electrode 112's portion contacted with the n-type diffusion layer 102 and the second contact electrode 113's portion contacted with the p-type diffusion layer 104 are specifically arranged so that each portion is formed of a first conductor 114 that is made of a metal silicide, such as nickel silicide (NiSi) for example, and a second conductor 116 made of a metal silicide that contains erbium (Er) or yttrium (Y) or the like, as an example.

A contact plug 118 made of tungsten (W) or else is buried or embedded between the metal wire and the metal-containing conductor of each of the first contact electrode 112 and second contact electrode 113.

The first conductor 114 may alternatively be made of metal silicides other than NiSi, such as for example $CoSi_2$, $TiSi_2$, etc. Still alternatively, the conductor 114 may be made of metal semiconductor compounds, such as metal germanides, metal silicon germanides or else, one of which is selectable depending on the kind of the semiconductor substrate used. Elemental substances of metals, e.g., pure metals, may also be employable when the need arises.

Regarding the rare earth metal-containing second conductor 116, Er or Y or metal silicides of other rare earth metals may be used therefor. In place of such metal silicides, other metal semiconductor compounds are employable, such as metal germanides or silicon germanides in accordance with the kind of the semiconductor substrate used. Pure rare earth metals may also be used for the conductor 116.

An explanation will next be given of functions and effects of the semiconductor device of this embodiment. See FIG. 2, which shows, in table form, height values of Schottky barriers for silicon in some representative silicides which are ordinarily used in the manufacture of semiconductor devices. These Schottky barrier height values are taught from "Properties of Metal Silicides," edited by Karen Maex and Marc van Rossum, INSPEC Publication (1995). As apparent from FIG. 2, silicides of Er and Y are very low in height of Schottky barrier for electrons. It is known that this tendency is substantially the same even in the case of pure or "stand-alone" rare earth metals, rather than silicides.

Accordingly, in this embodiment also, the second conductor 116 contains therein a rare earth metal whereby it is expectable that Schottky barrier height for electrons becomes lower at the contact portion with semiconductor.

Figure 3:
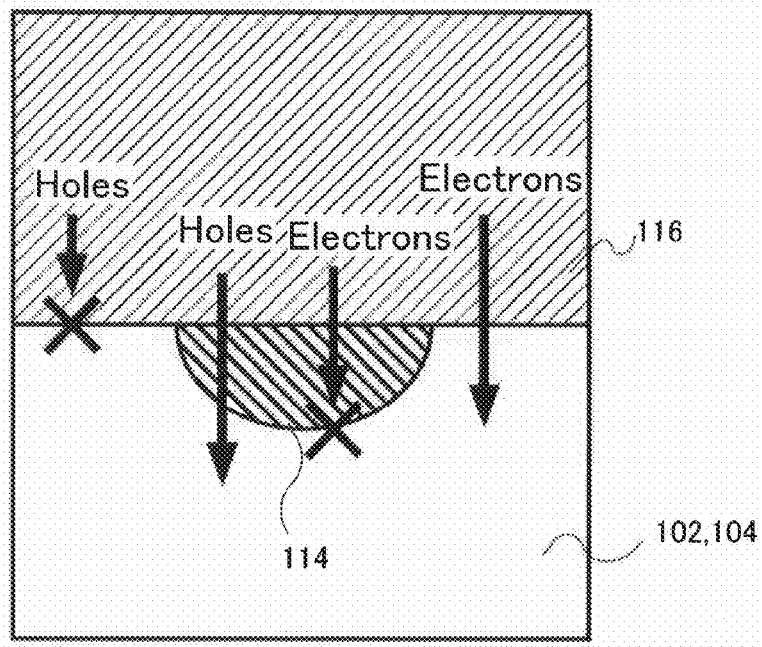
FIG. 3 is an enlarged sectional view of a contact portion between a contact electrode and a diffusion layer of the semiconductor device shown in FIG. 1.

FIG. 3 is an enlarged sectional view of the contact portion of a contact electrode with the diffusion layer 102, 104 in the semiconductor device of this embodiment. As stated above, the second conductor 116 contains the rare earth metal so that its Schottky barrier height for electrons at the semiconductor-contacted portion becomes relatively lower than that of the first conductor 114. Thus, in case majority carriers are electrons, an electrical current becomes relatively easier to flow between the second conductor 116 and the diffusion layer 102, 106, and thus the contact resistance becomes lower. Adversely, between the second conductor 116 and diffusion layer 102, 104, Schottky barrier height for holes becomes relatively higher than that of the first conductor 114. Due to this, in case the carriers are holes, it becomes difficult for electric current to flow with respect to the first conductor 114, resulting the contact resistance becoming higher. Regarding the first conductor 114, it becomes relatively higher in contact resistance than that of the metal-containing second conductor 116 when the majority carriers are electrons and becomes lower in contact resistance when the carriers are holes.

In this way, in the semiconductor device of the illustrative embodiment, the contact portion between the contact electrode and semiconductor diffusion layer is comprised of two different kinds of conductive materials, i.e., a conductor low in contact resistance with respect to electrons, and conductor low in contact resistance with respect to holes. Accordingly, electrons attempt to flow in the conductor low in contact resistance with respect to electrons whereas holes flow in the conductor low in contact resistance with respect to holes. In other words, when a current flows, a specific current path is selected which becomes automatically lower in contact resistance in a way depending on the kind of carriers. Thus, it is possible to realize the contact electrode that is less in contact resistance both for the electrons and for the holes.

Consequently, as shown in FIG. 1, electrons serve as majority carriers at the contact electrode 112 associated with the n-type diffusion layer 102 so that electrons chiefly flow in the rare earth metal-containing second conductor 116. On the contrary, at the second contact electrode 113 coupled to the p-type diffusion layer 104, holes become the carriers so that these holes chiefly flow in the first conductor 114. This makes it possible to achieve low-resistance contacts for both the n-type diffusion layer and the p-type diffusion layer while using the contact electrodes of the same structure. Owing to this feature, the semiconductor device of this embodiment offers an advantage as to its ability to realize low-resistance contacts for both the n-type diffusion layer and the p-type diffusion layer without having to require any complicated processes as will be described in detail later.

It should be noted that in this embodiment, the Schottky barrier height for holes between the first conductor and the p-type diffusion layer is preferably set to less than or equal to 0.50 electron-volts (eV) whereas the Schottky barrier height for electrons between the second conductor and the n-type diffusion layer is preferably set at 0.50 eV or less. The reason of this is as follows. As far as the Schottky barrier height is less than or equal to 0.50 eV with respect to both the electrons and the holes, it is possible to realize sufficiently low contact resistance even in semiconductor devices of the future generation with design rules becoming less than 30 nm.

It is also preferable in this embodiment that the first conductor is comprised of a specific metal silicide containing therein either nickel (Ni) or platinum (Pt) while letting the second conductor be made of a metal silicide.

This can be said because the nickel silicide (NiSi)'s Schottky barrier height for holes is as low as 0.45 eV as shown in FIG. 2, which makes it expectable to attain an effect of reduction of contact resistance for holes. Another effect is that NiSi per se is relatively low in electrical resistance. In addition, in the case of platinum silicide (PtSi), its Schottky barrier height for holes is as extra-low as 0.22 eV as shown in FIG. 2 so that it is expectable to obtain an effect of further reducing the contact resistance. In addition, there is another effect which follows: PtSi is higher in thermal robustness than NiSi. Note here that the use of pure PtSi is not always required: as far as Pt-containing NiSi is used, the contact resistance in the case of holes being the carriers is reduced, resulting in obtainment of an effect as to the improvement of thermal robustness also.

The second conductor is preferably made of a metal silicide because thermal stability is improved when compared to using a metal alone.

A fabrication method of the semiconductor device of this embodiment starts with a step which prepares a semiconductor substrate having a top surface. Then, form an n-type diffusion layer and a p-type diffusion layer in the substrate surface. Next, form a dielectric layer on the substrate surface to cover the n-type diffusion layer and p-type diffusion layer. Then, define a first contact hole in diffusion layer is partly exposed through the contact hole. Similarly, define a second contact hole in the dielectric layer so that the p-type diffusion layer is partly exposed through this contact hole. Then, deposit a first metal film in the areas in which the n-type diffusion layer and p-type diffusion layer are exposed, followed by execution of first thermal processing for causing the first metal film to react with the n-type diffusion layer and p-type diffusion layer, thereby to form a first metal semiconductor compound. Then, deposit on the first metal semiconductor compound a second metal film that contains a rare earth metal. Thereafter, second thermal processing is performed to force the second metal film to react with the first metal semiconductor compound to thereby form a second metal semiconductor compound while at the same time causing metal components in the first metal semiconductor compound to react with the n-type diffusion layer and p-type diffusion layer to thereby form a third metal semiconductor compound. Then, form a first metal wire in an area on the dielectric film which includes the first contact hole. Further, form a second metal wire in an area on the dielectric film which includes the second contact hole.

A detailed explanation will next be given of the semiconductor device fabrication method of this embodiment with reference to FIGS. 4 through 10 below.

Figure 4:
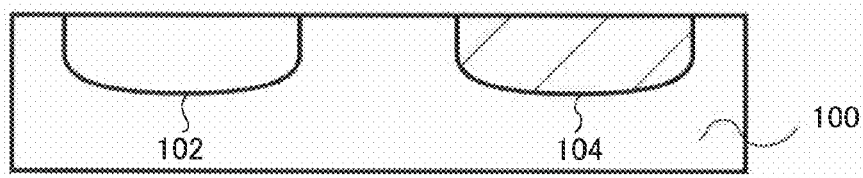
FIGS. 4 through 10 illustrate, in cross-section, some major steps in the manufacture of the semiconductor device of FIG. 1.

Firstly, as shown in FIG. 4, prepare a semiconductor substrate 100 made of p-type silicon with boron (B) being as its impurity. Then, dope an arsenic (As) impurity into a selected surface area on a top surface of substrate 100, by known lithography and ion implantation techniques, thereby forming an n-type diffusion layer 102. Subsequently in a similar way, introduce a B impurity into a selected area of the substrate surface to thereby form a p-type diffusion layer 104.

Figure 5:
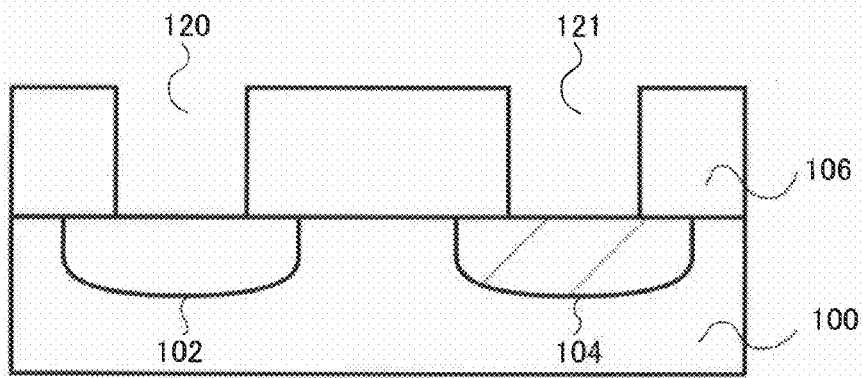

Next, as shown in FIG. 5, form on the semiconductor substrate 100 including the n-type diffusion layer 102 and p-type diffusion layer 104 a dielectric layer 106 made of silicon oxide by known low-pressure chemical vapor deposition (LPCVD) techniques. Then, define a first contact hole 120 in this dielectric film 106 by known lithography and reactive ion etch (RIE) techniques in such a manner that the n-type diffusion layer 102 is partly exposed through this hole. Similarly, define in the dielectric film 106 a second contact hole 121 so that the p-type diffusion layer 104 is partly exposed therethrough.

Figure 6:
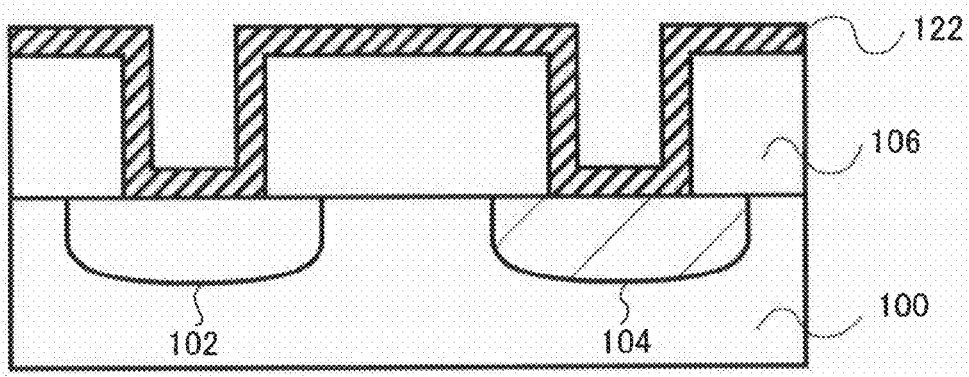

Next as shown in FIG. 6, deposit by known sputtering a first metal film 122 made of Ni so that this film covers the substrate surface areas in which the n-type diffusion layer 102 and p-type diffusion layer 104 are exposed.

Figure 7:
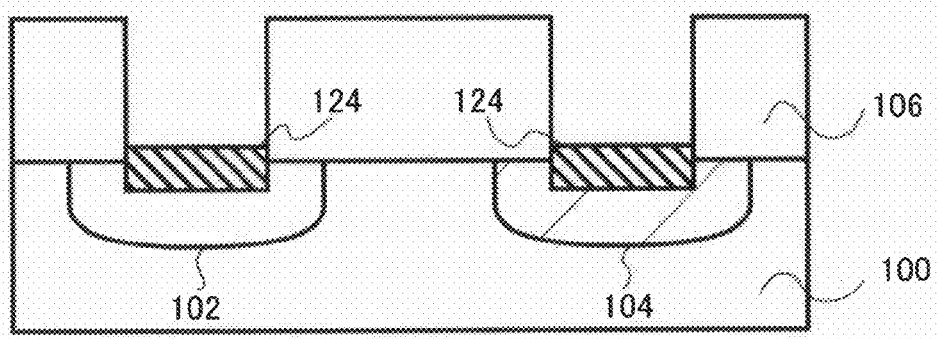

Next as shown in FIG. 7, first-time thermal processing is performed in an inert gas atmosphere within known single wafer type rapid thermal processing (RTP) apparatus or else for causing the Ni film that is the first metal film 122 to react with Si in the n-type diffusion layer 102 and p-type diffusion layer 104 to thereby form a NiSi film that is the first metal semiconductor compound 124. Thereafter, selectively remove by known wet etching unreacted portions of the Ni film that is the first metal film 122.

Figure 8:
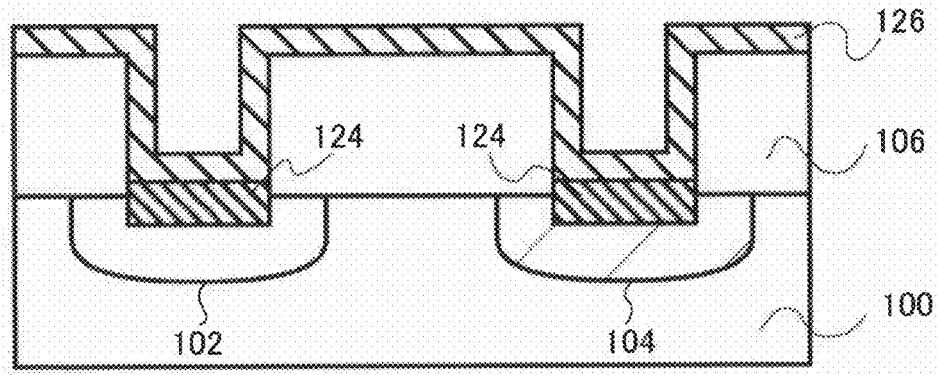

Next as shown in FIG. 8, deposit by known sputtering, deposition or other similar suitable processes a rare earth metal-containing second metal film 126, e.g., Er film, on the NiSi film that is the first metal semiconductor compound 124.

Figure 9:
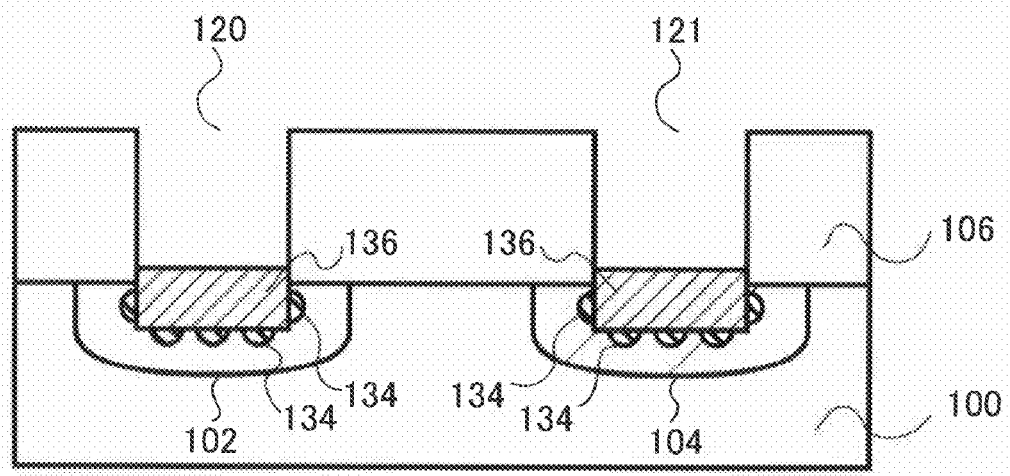

Next as shown in FIG. 9, perform second-time thermal processing by known single wafer type RTP apparatus in an inert gas atmosphere. A thermal processing temperature in this case is an appropriate temperature selected in accordance with the kind of the rare earth metal used. This second-time thermal processing causes the Er film that is the second metal film 126 (FIG. 8) and the NiSi film that is the first metal semiconductor compound 124 (FIG. 8) to react together to thereby form a rare earth metal-containing second metal semiconductor compound 136 (corresponding to the rare earth metal-containing second conductor 116 of FIG. 1)—here, Er-containing NiSi film. Simultaneously, force Ni in the NiSi film that is the first metal semiconductor compound 124 (FIG. 8) to react with Si in the n-type diffusion layer 102 and p-type diffusion layer 104, thereby to form a NiSi that is a third metal semiconductor compound 134 (corresponding to the first conductor 114 of FIG. 1) at an interface between the n-type diffusion layer 102 and p-type diffusion layer 104. Then, selectively remove unreacted portions of the Er film that is the second metal film 126 (FIG. 8) by known wet etching or the like.

Figure 10:
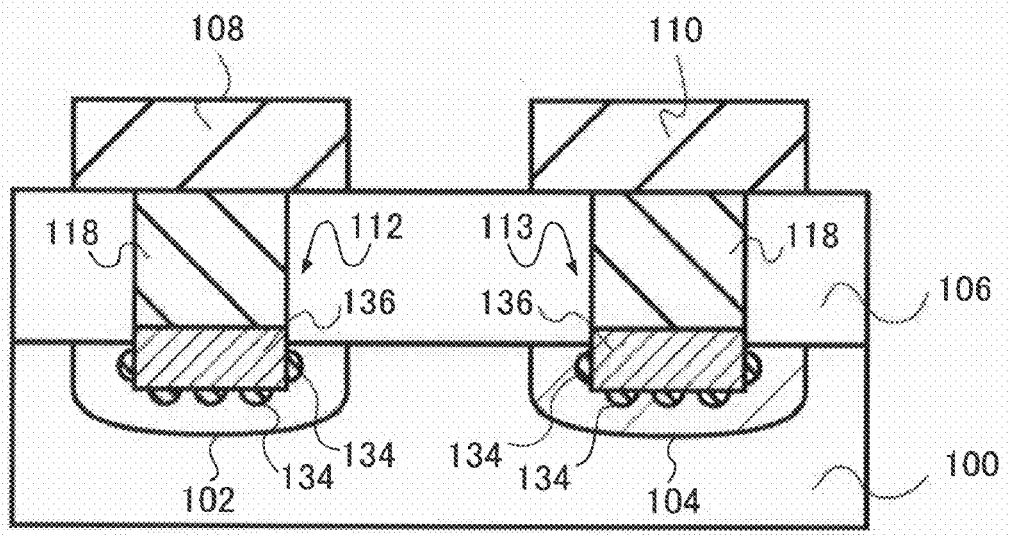

Thereafter, as shown in FIG. 10, form electrical contact plugs 118 made of tungsten (W) or else in the contact holes 120 and 121 by known LPCVD and chemical-mechanical polish (CMP) techniques. Then, form by known sputtering, lithography and/or RIE processes a first metal wiring line 108 made of aluminum (Al) as an example in an area including the first contact hole 120 on dielectric film 106. Similarly, form a second metal wire 110 in an area including the contact plug 118 on dielectric film 106.

In this embodiment the first metal film is preferably made of a metal which contains therein either nickel (Ni) or platinum (Pt). This can be said because letting the first metal film be the Pt-containing metal film ensures that the third metal semiconductor compound 134 becomes a Pt-containing metal semiconductor compound, e.g., silicide that contains Ni or Pt when the semiconductor substrate is made of silicon, whereby the third metal semiconductor compound 134's Schottky barrier height for holes becomes lower as stated previously so that it is expectable to attain excellent effects, such as the effect of reducing the contact resistance with respect to holes.

Next, a detailed explanation will be given of the effect as to formation of the third metal semiconductor compound 134 (FIG. 10) in this embodiment while referring to FIGS. 11A to 11E. Here, the explanation is given by taking as an example one specific case where the semiconductor substrate is made of Si, the first metal film is Ni, and the second metal film is Er.

Figure 11A:
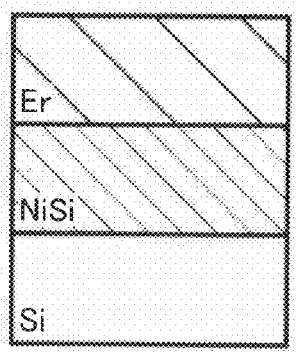
FIGS. 11A to 11E are diagrams for explanation of effects of the semiconductor device shown in FIG. 1.

FIG. 11A is an enlarged sectional diagram of a portion which illustratively consists of the n-type diffusion layer 102 or p-type diffusion layer 104, first metal semiconductor compound 124, and second metal film 126 at the process step of FIG. 8. Here, the diffusion layer part is Si; the first metal semiconductor compound 124 that was formed by reaction of Si and Ni of the first metal film during the first-time thermal processing is made of NiSi. The second metal film 126 is Er.

Figure 11B:
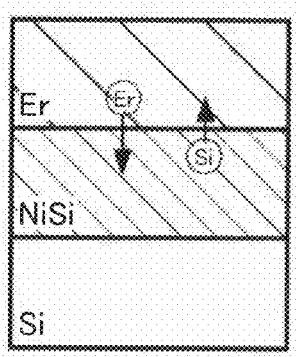

The structure of FIG. 11A is applied the second-time thermal processing. By this thermal processing, Er diffuses to the NiSi film side while Si in NiSi film diffuses to the Er film side as shown in FIG. 11B, resulting in solid-state reaction. Here, in the case of the second metal film being made of Er or Y, the thermal processing temperature is preferably set to range from 500° C. to 700° C. The reason of this is as follows. If the temperature is below this range, the solid-state reaction of Er and NiSi is difficult to progress. Alternatively, if the temperature exceeds the range, the solid-state reaction of Er and NiSi becomes too fast, resulting in difficulty in formation of superior morphology of the interface between semiconductor and silicide.

Figure 11C:
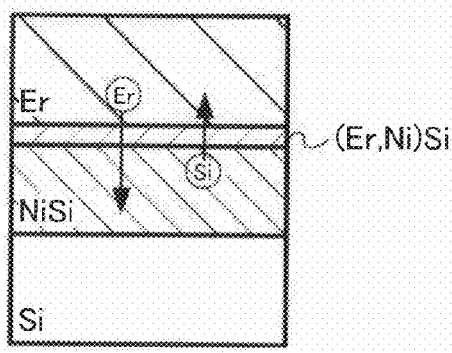

As shown in FIG. 11C, the solid-state reaction permits Si to react with Er and Er to be replaced by Ni that is part of NiSi, resulting in formation of Er-containing NiSi that is the second metal semiconductor compound—i.e., (Er, Ni)Si.

Figure 11D:
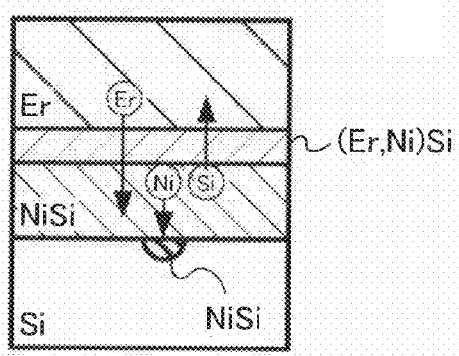

As shown in FIG. 11D, residual Ni after the replacement with Er reacts with Si on the substrate side and thus is silicided again, resulting in segregation as NiSi at the Si interface to thereby form clusters. This NiSi is equivalent to the above-noted third metal semiconductor compound.

Figure 11E:
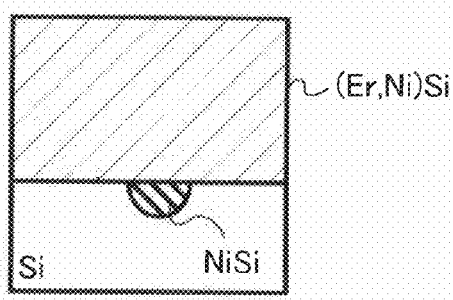

Finally, as shown in FIG. 11E, an entire part of NiSi that has been the first metal semiconductor compound becomes (Er,Ni)Si, which is the second metal semiconductor compound. This results in formation of an electrode with the both conductors of (Er,Ni)Si and NiSi having contacts with Si, wherein the NiSi is the third metal semiconductor compound.

It is noted that the aforesaid effect of this fabrication example takes place based on mechanisms which follow: the rare earth metal performs silicidation reaction with Si being as the diffusion species therefor; and Ni performs silicidation reaction with Ni being as the diffusion species. It is thus considered that similar mechanisms work even when using a rare earth metal other than Er or Y and a metal different from Ni, such as Pt.

According to the semiconductor device fabrication method of this embodiment, both the metal-containing conductor that is less in electrical contact resistance with respect to electrons and the metal-containing conductor that is less in contact resistance for holes are in contact with the semiconductor on the substrate so that it becomes possible to achieve a semiconductor device having contact electrodes that are less in contact resistance both for electrons and for holes at a time. This makes it unnecessary to prepare different electrode materials, one of which is used for electron and the other of which is for holes. Therefore, it is no longer required for the semiconductor device fabrication method of this embodiment to separately form a contact electrode for the n-type diffusion layer and a contact electrode for the p-type diffusion layer. This results in appreciable simplification of the fabrication process of the semiconductor device, which in turn leads to advantageous contribution to improvement of manufacturing yields, shortening of fabrication time period, and reduction of production costs.

Figure 12:
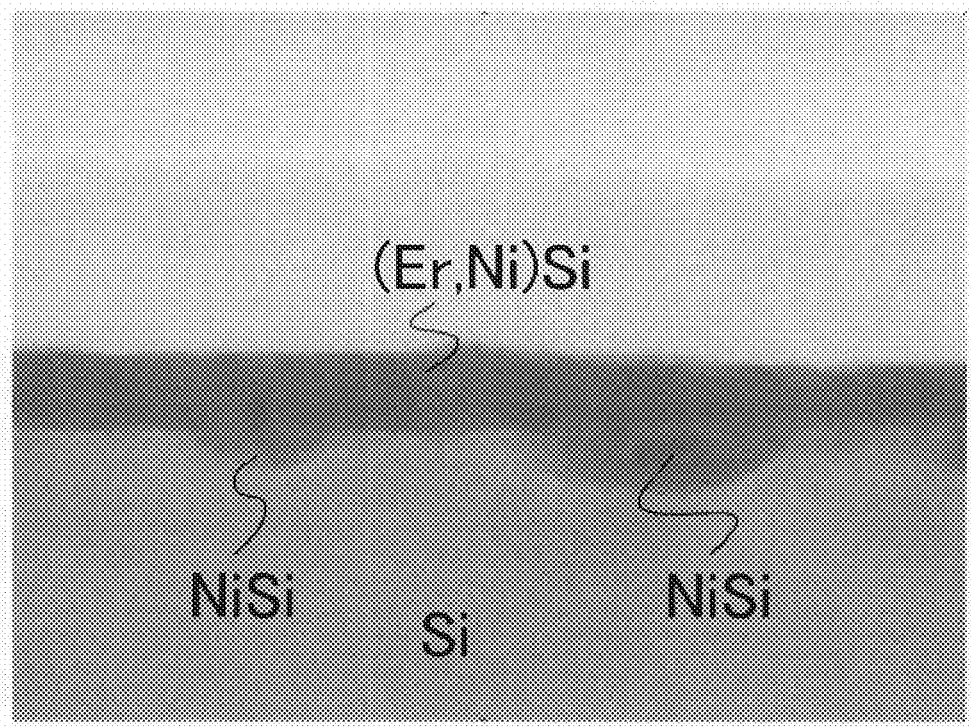
FIGS. 12 and 13 are photographs each showing a sectional TEM image of the semiconductor device of FIG. 1.

See FIG. 12, which is a photograph showing a transmission electron microscope (TEM) observation image of a cross-section of a contact portion of an electrode which was fabricated by the fabrication method of this embodiment in case the semiconductor substrate is made of Si, the first metal film is Ni, and the second metal film is made of Er. The second-time thermal processing was done at a temperature ranging from 500 to 700° C. As apparent from viewing this photograph, NiSi is segregated to the interface of (Er,Ni)Si and Si in the form of clusters.

Figure 13:
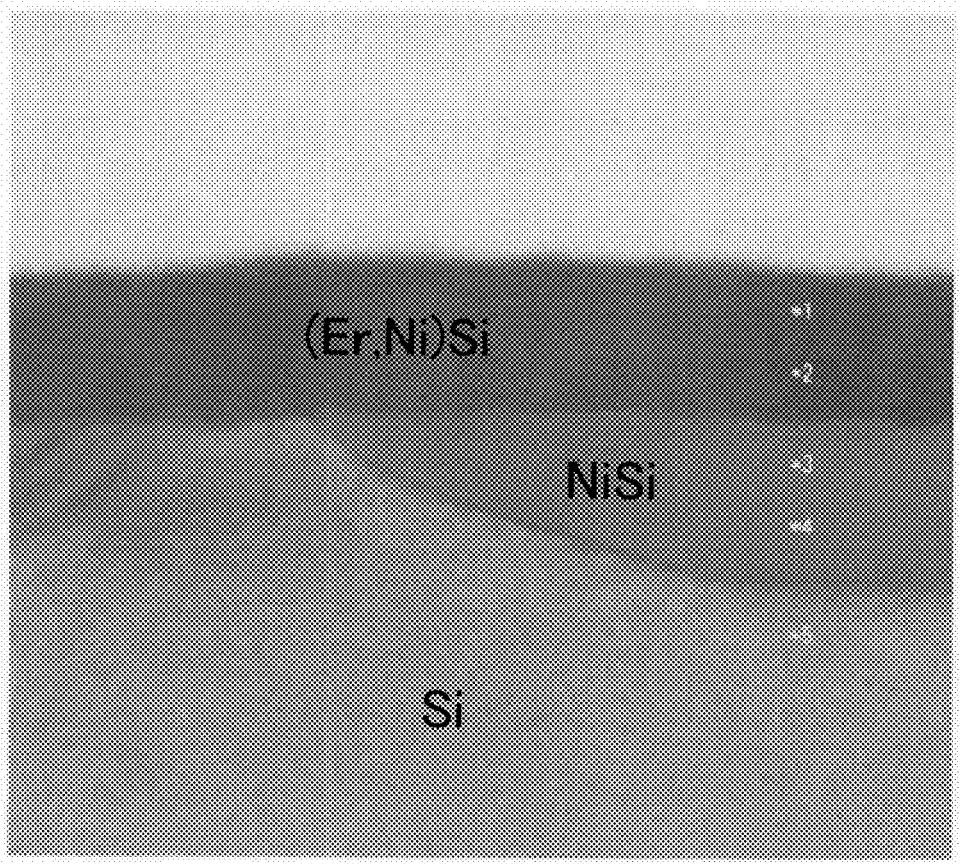
Figure 14A:
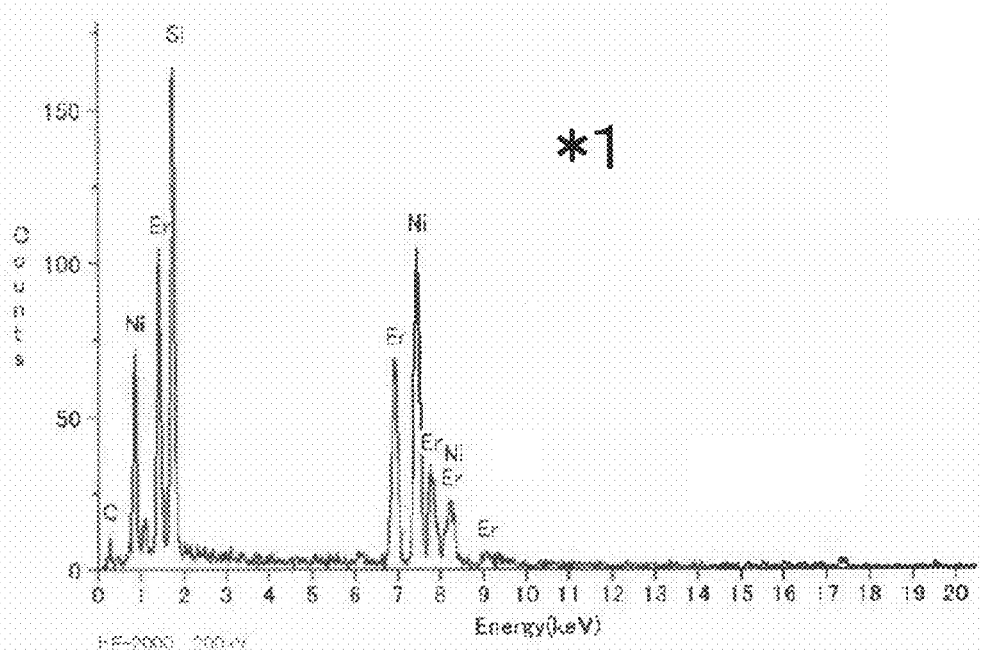
FIGS. 14A-14B are diagrams graphically showing EDX analysis results of the semiconductor device of FIG. 1.
Figure 14B:
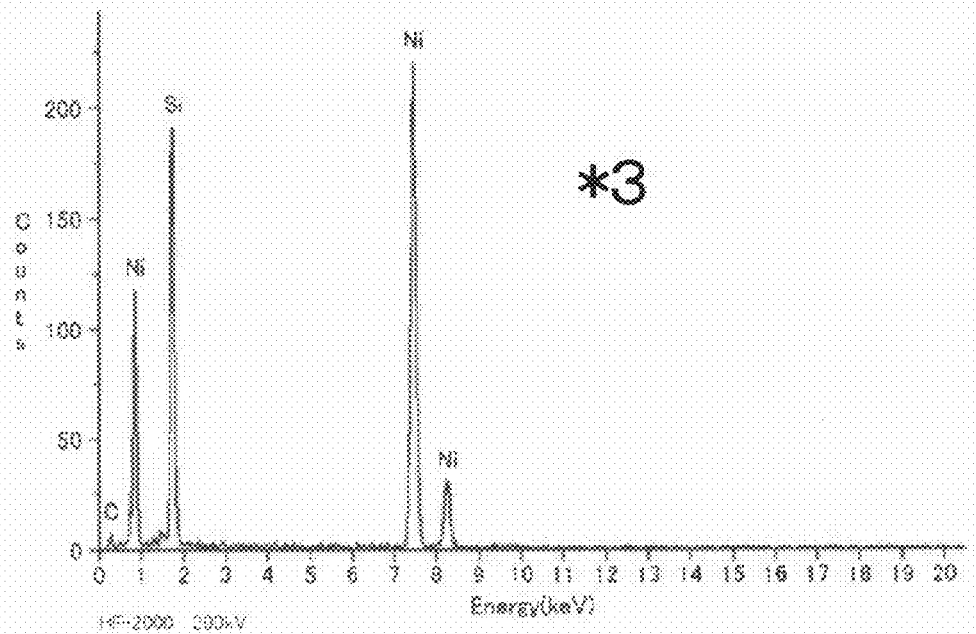

See next FIG. 13, which is a cross-section TEM image with the electrode's contact portion with semiconductor being further magnified. For five different location points "*1" to "*5" in this cross-section TEM image, energy dispersive X-ray (EDX) analysis was performed. Analysis results of two of these five points, i.e., points *1 and *3, are graphically shown in FIGS. 14A and 14B, respectively. FIG. 14A shows the analysis result of the point *1, and FIG. 14B is that of point *3. In FIG. 14A, sharp peaks of Er, Ni and Si are detected. This demonstrates successful formation of the Er-containing NiSi. In FIG. 14B, only peaks of Ni and Si are detected, which makes sure that the cluster-shaped portion is NiSi that does not contain Er. Additionally, regarding the point *2, a similar analysis result to that of the point *1 was obtained. As for the point *4, a similar result to that of the point *3 was obtained. For the point *5, only a peak of Si of the substrate was detected.

Figure 15:
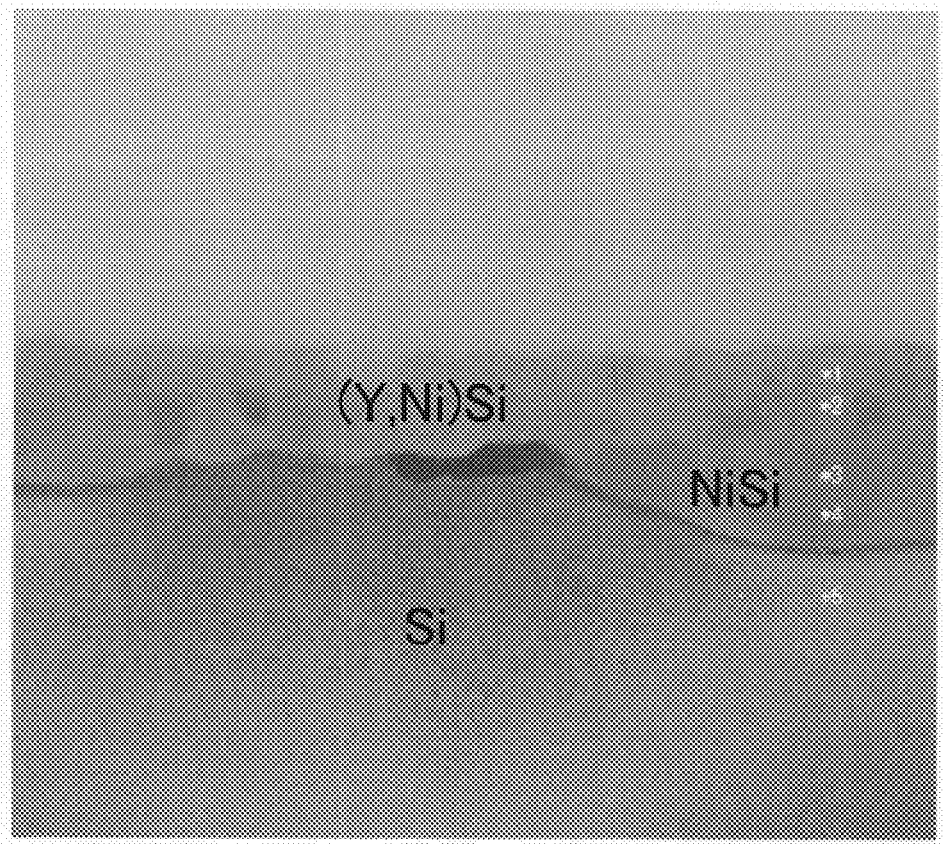
FIG. 15 is a photograph showing a sectional TEM image of the semiconductor device of FIG. 1.
Figure 16A:
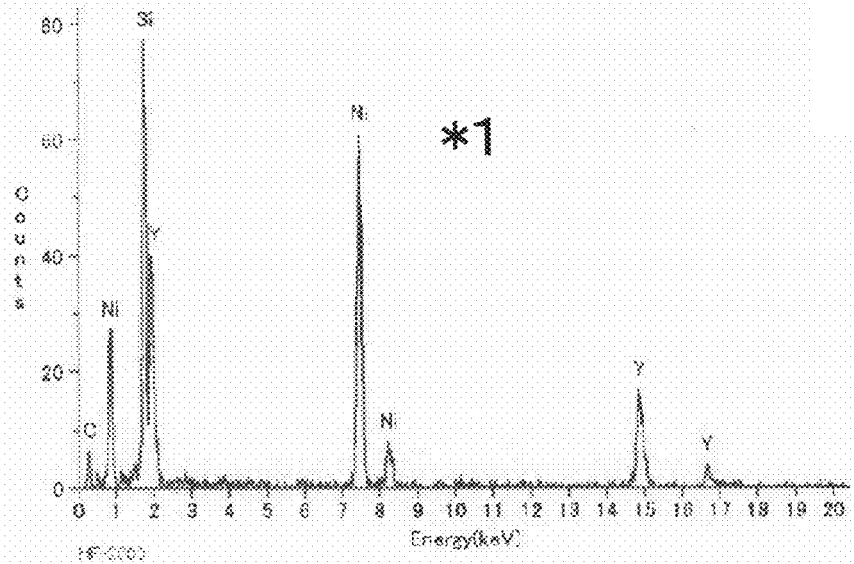
FIGS. 16A-16B are graphs showing EDX analysis results of the semiconductor device of FIG. 1.
Figure 16B:
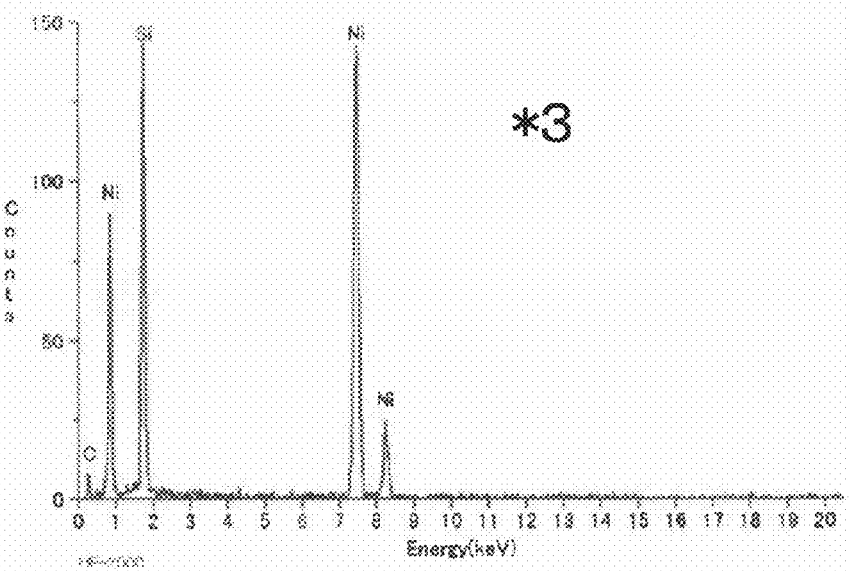

Turning to FIG. 15, a cross-section TEM image is shown with magnification of a contact portion of electrode with semiconductor in case the second metal film is made of Y rather than Er. For five different location points *1 to *5 in this TEM image, EDX analysis was performed. Analysis results of two of these five points, i.e., points *1 and *3, are graphically shown in FIGS. 16A and 16B. FIG. 16A shows the analysis result of the point *1, and FIG. 16B is that of point *3. In FIG. 16A, peaks of Y, Ni and Si are detected. This demonstrates successful formation of the Y-containing NiSi. In FIG. 16B, only peaks of Ni and Si are detected, which ascertains that the cluster-like portion is NiSi that does not contain Y. Additionally, regarding the point *2, a similar analysis result to that of the point *1 was obtained. As for the point *4, a similar result to that of the point *3 was obtained. For the point *5, only a peak of Si of the substrate was detected.

In the semiconductor device fabrication method of this embodiment, in the case where the semiconductor substrate is Si with the first metal film being Ni film and with the second metal film being Er or Y film, it is preferable that the second metal film be arranged to have its thickness which is greater than or equal to 10 percent (%) of the thickness of first metal semiconductor compound and yet less than 100% of the same.

The EDX analysis results reveal that in the case of the semiconductor substrate being made of Si and the first metal film being Ni and the second metal film being made of Er or Y, execution of the second-time thermal processing at temperatures of from 500 to 700° C. results in that the ratio of Ni atoms to rare earth metal atoms in the resultant Er— or Y-containing NiSi film becomes approximately 3:2. In this case, when calculating a condition(s) for letting all Ni atoms in the NiSi film be included in its overlying rare earth element-containing NiSi film, it is made sure that the thickness of the rare earth metal film that is the second metal film is about 1 for the thickness, 1, of a NiSi film which is the first metal semiconductor compound. Therefore, in the above-noted thermal processing conditions, it is required for production of NiSi clusters at the interface that the thickness of rare earth metal film be less than the thickness of NiSi film. On the other hand, in case the rare earth metal film is extremely thin, reaction occurs only at a location near or around the interface between NiSi and rare earth metal film. Due to this, it is necessary for the rare earth metal-containing NiSi film to reach the Si interface that the thickness of rare earth metal film be at least 10%, or more, of the thickness of the initial NiSi film.

Consequently, it is preferable that the thickness of the second metal film is greater than or equal to 10% of that of the first metal semiconductor compound and yet less than 100% of the same, as stated previously.

Note here that in the case of electrons being flown in the contact electrode of the semiconductor device manufactured by the semiconductor device fabrication method of this embodiment, i.e., the semiconductor device shown in FIG. 1, these electrons behave to flow in a specific contact portion(s) of the rare earth metal-containing second conductor 116 that is less in contact resistance for electrons with its associated semiconductor material—in the above-stated example, the contact portion between the Er— or Y-containing NiSi film and Si. By contrast, in the case of holes being flown, these flow in a contact portion(s) of the first metal-containing conductor 114 that is less in contact resistance for holes with its associated semiconductor material—in the example above, the contact portion between the NiSi film and Si.

A total contact resistance concerning electrons and holes is determinable by both the area of a portion at which the rare earth metal-containing second conductor 116 is in direct contact with the semiconductor and the area of a portion whereat the first metal-containing conductor 114 of the cluster shape is directly contacted with the semiconductor. A ratio of these areas is adjustable through adjustment of a ratio of the thickness of first metal semiconductor compound—in the example above, NiSi-versus the thickness of the second metal film that contains a rare earth metal—in the example, Er or Y—in the fabrication method stated supra.

Thus, the semiconductor device fabrication method of this embodiment is capable of setting the contact resistance of the contact electrode for electrons and for holes to any desired values by adjusting the thickness ratio of the first metal semiconductor compound (or the first metal film) and the second metal film.

In addition, according to the fabrication method of this embodiment, the interface between Si of the rare earth metal-containing silicide layer and NiSi clusters, in particular, is kept flat or well planarized as apparent from the cross-section TEM photographs of FIGS. 12-13 and 15 also, resulting in the electrode morphology being well retained. It is very likely that this is owing to the fact that implementation of the fabrication method of this embodiment results in generation of specific reaction for replacement of Ni in the NiSi film and Si in Si substrate by the interface.

As previously stated, it is traditionally known that whenever a pure rare earth metal is silicided, the substrate Si exhibits severe diffusion in the direction of such rare earth metal; thus, a large concave-convex structure can appear at an interface between silicide layer and Si substrate, resulting in the electrode morphology being extremely degraded. However, according to this embodiment, the electrode morphology is well retained. This makes it possible to reduce or minimize bad influences upon semiconductor devices, such as unwanted creation of crystal defects and junction leakage currents, which are occurrable at electrodes to be formed by prior known rare earth metal silicide electrode fabrication methods.

Second Embodiment

A semiconductor device in accordance with a second embodiment of this invention is the one that has an n-type metal insulator semiconductor field effect transistor (nMISFET) which is formed in a first semiconductor area on a semiconductor substrate and a p-type MISFET (pMISFET) which is formed in a second semiconductor area on the substrate. The nMISFET has its source and drain semiconductor regions which are formed in the first semiconductor area, and source and drain electrodes which are formed on or above these source and drain regions. The pMISFET has its source and drain semiconductor regions which are formed in the second semiconductor area, and source and drain electrodes which are formed to overlie these source and drain regions. The source and drain electrodes of the nMISFET has first portions which are in contact with the source and drain regions of the nMISFET. The source and drain electrodes of the pMISFET has second portions contacted with the source and drain regions of the pMISFET. Each of the first and second portions is formed of a first conductive material containing therein a metal and a second conductive material containing therein a rare earth metal.

Figure 17:
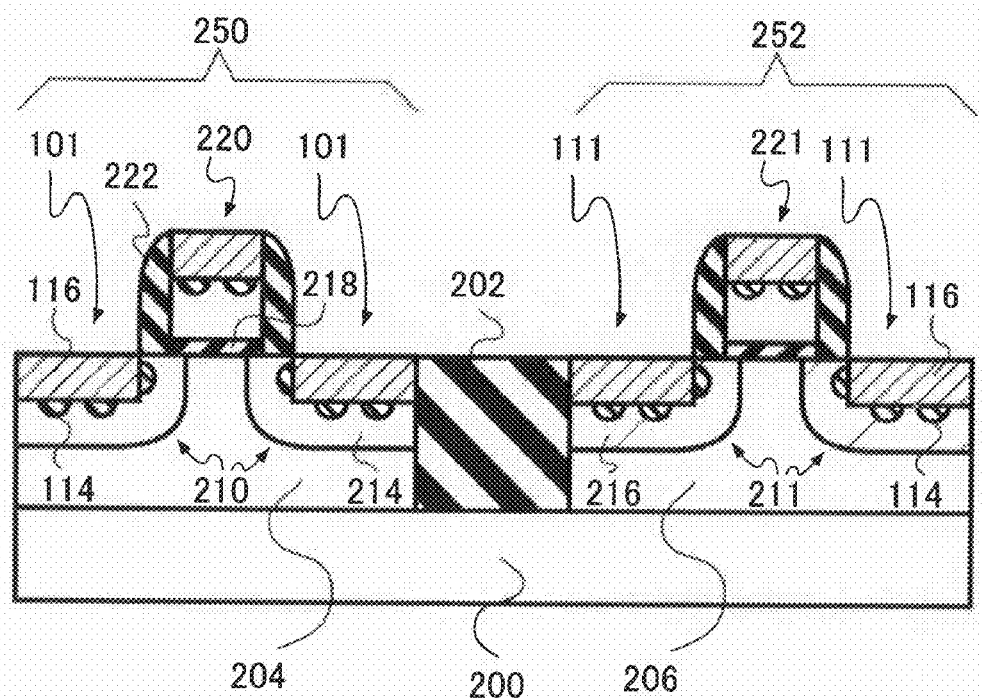
FIG. 17 depicts, in cross-section, a device structure of a semiconductor device in accordance with another embodiment of the invention.

FIG. 17 illustrates, in cross-section, a semiconductor device structure in accordance with the second embodiment of the invention. The device of this embodiment has, on a semiconductor substrate 200 made of p-type silicon with boron (B) contained therein as its impurity, an n-channel type MISFET (nMISFET) which is formed in a first semiconductor region 204 made of a p-type semiconductor well that is higher in impurity concentration than the semiconductor substrate 200 with B as its impurity. The semiconductor device of this embodiment also includes a p-channel type MISFET (pMISFET) which is formed in a second semiconductor region 206 on the semiconductor substrate 200, which region is comprised of an n-type well that contains phosphorus (P) as its impurity.

The nMISFET 250 that is formed in the first semiconductor region 204 has a couple of spaced-apart source and drain semiconductor regions 210 and a pair of source and drain electrodes 101 which are formed thereon, respectively. The pMISFET 252 that is formed in the second semiconductor region 206 has a pair of source and drain semiconductor regions 211, and source and drain electrodes 111 which are formed thereon respectively.

The source and drain electrodes 101 of nMISFET 250 have portions that are in contact with the source and drain regions 210 of nMISFET 250. The source and drain electrodes 111 of pMISFET 252 have portions which are contacted with the source and drain regions 211 of pMISFET 252. These contact portions are arranged so that each is formed, for example, of a cluster-shaped first conductor 114 made of a metal silicide such as NiSi and a second conductor 116 that contains therein a rare earth metal, such as Er or Y or else.

In this embodiment, the first semiconductor region 204 that is p-well and the second semiconductor region 206 that is n-well are electrically separated from each other by a device isolation region 202, which is formed of a silicon oxide film-buried shallow trench isolation (STI).

The nMISFET 250 has a gate electrode 220 formed above the first semiconductor region 204, with a gate insulator film 218 made of either silicon oxide or high-dielectric-constant (high-k) insulative material being interposed between the first region 204 and gate electrode 220. This gate electrode is formed of polycrystalline silicon (poly-Si) doped with an n-type impurity and a conductor 114, 116 which contains a metal that is similar to the source and drain electrodes 101 of nMISFET 250. Gate electrode 220 has both side faces, on each of which is formed a sidewall insulator film 222 made of silicon nitride. The source and drain electrodes 101 are self-aligned with the outer surfaces of sidewall insulator films 220 on the both sides of the gate electrode 220. The source and drain regions 210 of nMISFET 250 are associated with heavily-doped n ($n^+$) type source and drain diffusion layers 214 with As as the impurity thereof, respectively, as shown in FIG. 17.

Similarly, the pMISFET 252 has a gate electrode 221 formed above the second semiconductor region 206, with a gate insulator film 218 made of either silicon oxide or high-k dielectric material being sandwiched between the second region 206 and gate electrode 221. This gate electrode is formed of poly-Si doped with a p-type impurity and a conductor 114, 116 which contains a metal that is similar to the source and drain electrodes 111 of pMISFET 252. Gate electrode 221 has both sidefaces, on each of which a silicon-nitride sidewall insulator film 222 is formed. The source and drain electrodes 111 are self-aligned with the outer surfaces of sidewall insulators 222 on the both sides of gate electrode 222. The source and drain regions 211 of pMISFET 252 are associated with heavily-doped p ($p^+$) type source and drain diffusion layers 216 with B as the impurity thereof, respectively, as shown in FIG. 17.

Although the gate electrodes 220 and 221 of nMISFET 250 and pMISFET 252 are each formed of the poly-Si and the metal-containing conductor 114, 116, these gate electrodes may alternatively be arranged so that each is entirely made of a metal silicide to thereby have the so-called fully-silicided (FUSI) structure. Still alternatively, each gate electrode may be formed of either a mono-metal layer or a stacked layer made of more than two metals.

Note that the semiconductor device of this embodiment is the one that applies the contact electrode structure of the semiconductor device of the first embodiment—in particular, the structure of contact electrode's contact portion with its associated semiconductor diffusion layer shown in FIG. 1—to the source/drain electrode structure used in nMISFET and pMISFET. Accordingly, explanations as to structures and functions plus effects that are similar to those of the first embodiment will be partly eliminated herein.

In the semiconductor device of this embodiment, the contact part between source/drain electrode and semiconductor diffusion layer is comprised of two different kinds of conductive materials—i.e., an electrical conductor that is low in contact resistance with respect to electrons, and a conductor low in contact resistance for holes. Accordingly, electrons flow in the conductor low in Schottky barrier height with respect to electrons whereas holes flow in the conductor low in Schottky barrier height for holes. In other words, whenever a current flows, a specific current path is selected which becomes automatically lower in contact resistance in a way depending on the kind of carriers. Thus it is possible to realize the source/drain electrode that is less in contact resistance irrespective of whether the majority carriers are electrons or holes. This enables application of the same electrode structure to both the nMISFET with electrons as its majority carriers and the pMISFET with holes as its carriers while at the same time appreciably reducing parasitic resistance of these MISFETs. Thus it becomes possible to achieve semiconductor devices having a high-performance complementary metal oxide semiconductor (CMOS) transistor structure.

In this embodiment also, the Schottky barrier height for holes between the first conductor and the p-type diffusion layer is preferably set to 0.50 eV; the Schottky barrier height for electrons between the second conductor and the n-type diffusion layer is preferably set at 0.50 eV. When the Schottky barrier height is less than or equal to 0.50 eV with respect to both the electrons and the holes, it is possible to realize sufficiently low contact resistance even in semiconductor devices of future generations with design rules becoming less than 30 nm.

In this embodiment, from viewpoints of contact resistance reduction and improvement of heat durability, the first conductor is preferably made of a metal silicide that contains either nickel (Ni) or platinum (Pt) whereas the second conductor is comprised of a metal silicide as in the first embodiment.

A semiconductor device fabrication method of this embodiment is a fabrication method of a semiconductor device which has on a semiconductor substrate an nMISFET and a pMISFET. First, form on this semiconductor substrate gate electrodes of the nMISFET and pMISFET with a gate insulator film being interposed therebetween. Then, form a sidewall dielectric film on both side faces of each gate electrode. Then, deposit a first metal film in surface areas on the semiconductor substrate, which become source and drain electrodes of the nMISFET and pMISFET. Next, first thermal processing is performed to cause the first metal film to react with the semiconductor substrate to thereby form a first metal semiconductor compound. Then, deposit on the first metal semiconductor compound a second metal film that contains a rare earth metal. Then, second thermal processing is carried out to cause the second metal film to react with the first metal semiconductor compound to thereby form a second metal semiconductor compound. Simultaneously, let a metal in the first metal semiconductor compound react with the semiconductor substrate, thereby forming a third metal semiconductor compound.

An explanation will next be given of the semiconductor device fabrication method of this embodiment with reference to FIGS. 18-24 below.

Figure 18:
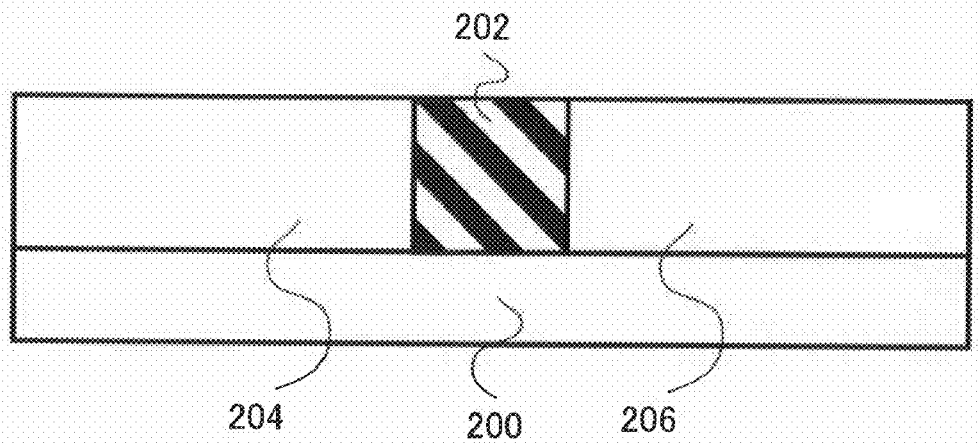
FIGS. 18 to 24 illustrate, in cross-section, some major steps in the manufacture of the semiconductor device shown in FIG. 17.

Firstly, as shown in FIG. 18, form on a semiconductor substrate 200 made of p-type silicon with boron (B) as its impurity a trench-like groove in an area that becomes a device isolation region 202, by known lithography and RIE techniques. After having deposited a silicon oxide film or the like in an area which includes this groove by known LPCVD techniques, form the device isolation region 202 by removing those portions of the silicon oxide film of an area other than the groove by use of known CMP techniques. Thereafter, perform known lithography and ion implantation processes to introduce B impurity into a prespecified region to thereby form a p-type semiconductor well for use as first semiconductor region 204. Subsequently, in a similar way, phosphorus (P) impurity is doped into a specified area to form an n-type well that is second semiconductor region 206.

Figure 19:
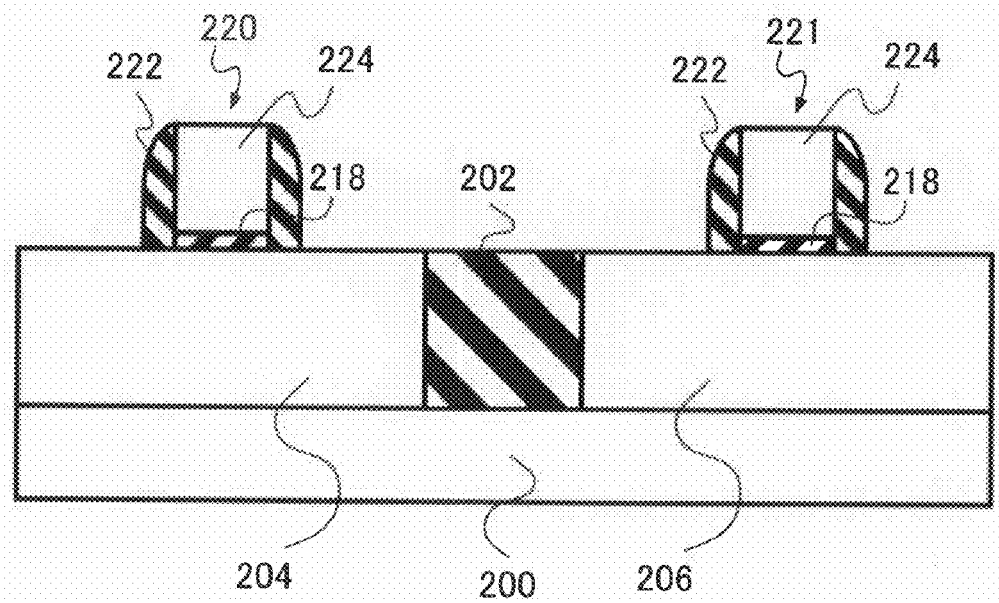

Next, as shown in FIG. 19, form a silicon oxide film on the semiconductor substrate 200, which film becomes gate insulator films 218. Then, deposit thereon a poly-Si film 224. Thereafter, use known lithography and RIE methods to form gate electrodes 220 and 221 above the semiconductor substrate 200 with the gate insulator films 218 being interposed therebetween. Next, perform deposition and selective etching of a silicon nitride film by known LPCVD and RIE techniques to thereby form a sidewall dielectric film 222 on the both side faces of each gate electrode 220, 221.

Figure 20:
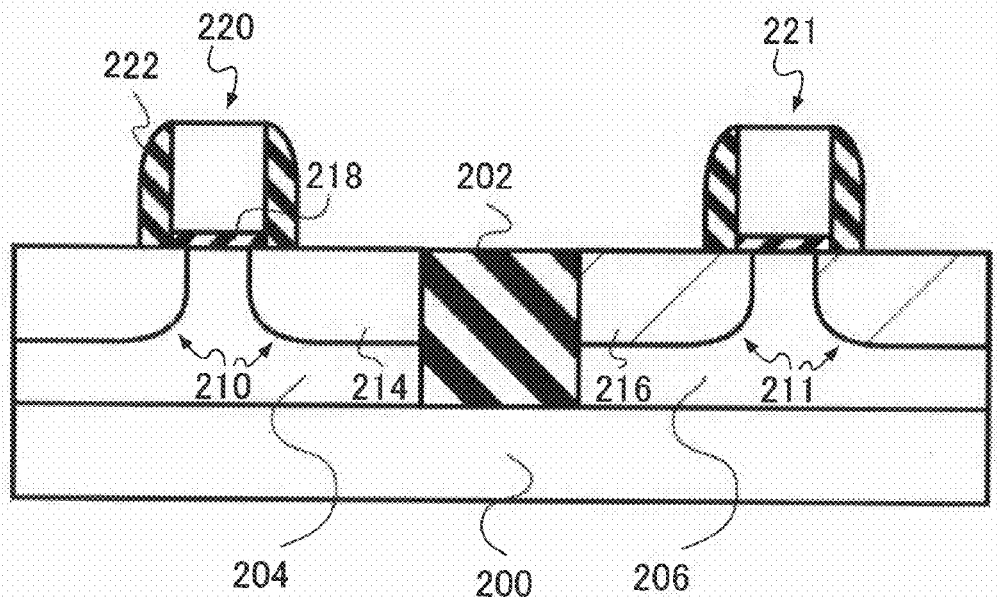

Next as shown in FIG. 20, use known lithography and ion implantation techniques to introduce an arsenic (As) impurity into the first semiconductor region 204, thereby to form n-type source and drain diffusion layers 214 in the source and drain semiconductor regions 210 of the nMISFET. Similarly, dope a B impurity into the second semiconductor region 206 to thereby form p-type source and drain diffusion layers 216 in the source and drain semiconductor regions 211 of the pMISFET. It is also permissible, during the formation of these source/drain diffusion layers, to introduce the As impurity into the gate electrode of nMISFET and to introduce the B impurity into gate electrode 221 of pMISFET, thereby letting them be n-type poly-Si and p-type poly-Si, respectively.

Figure 21:
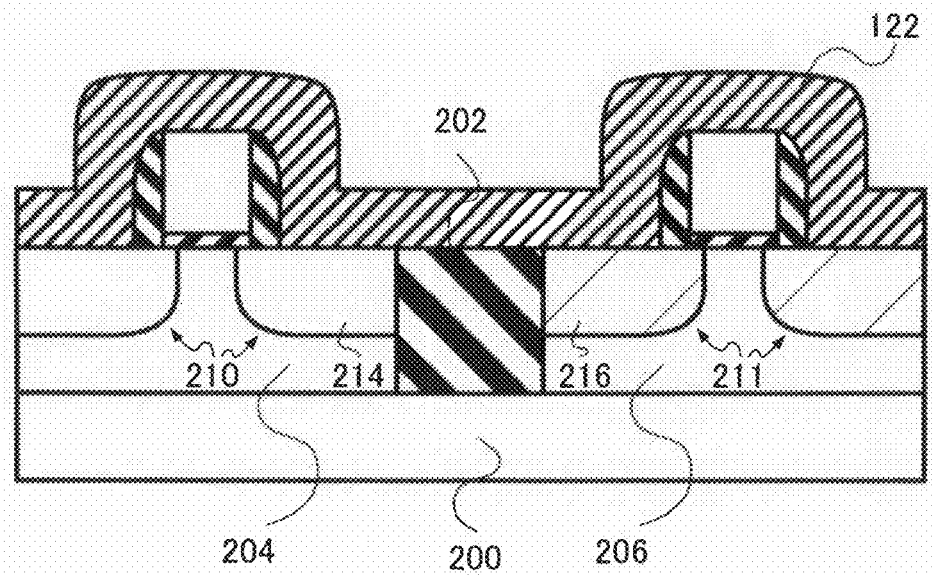

Next as shown in FIG. 21, deposit by known sputtering a first metal film 122 made for example of Ni on surface areas that become the source and drain electrodes of nMISFET and pMISFET on the semiconductor substrate 200—here, the n-type source and drain diffusion layers 214 and p-type source/drain diffusion layers 216.

Figure 22:
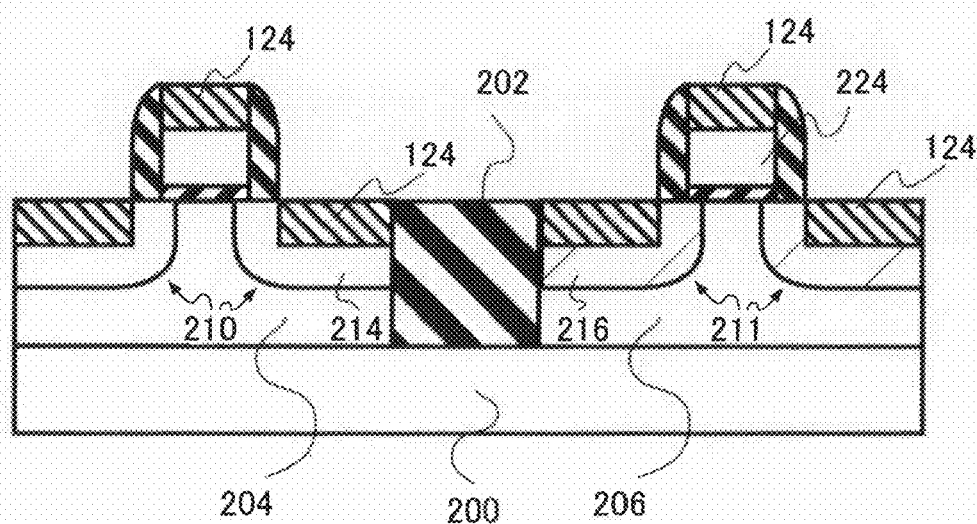

Next as shown in FIG. 22, first-time thermal processing is performed in an inert gas atmosphere in known single wafer type RTP equipment for causing the first metal film 122 to react with the semiconductor substrate 200—here, the n-type source and drain diffusion layers 214 and p-type source/drain diffusion layers 216—to thereby form a NiSi that is the first metal semiconductor compound 124. Then, selectively remove by known wet etching unreacted portions of the first metal film 122.

Figure 23:
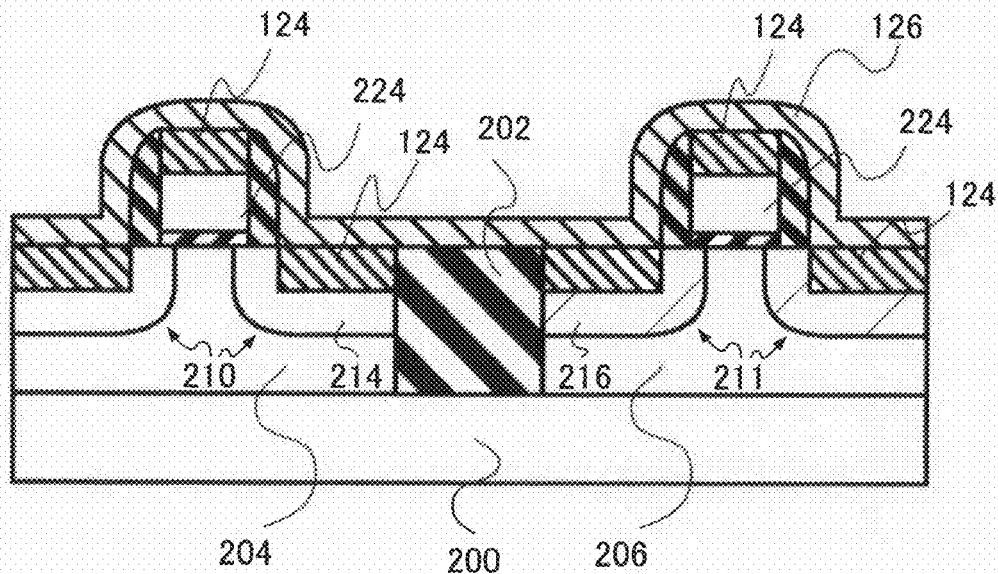

Next as shown in FIG. 23, deposit by known sputtering, deposition or other suitable processes a rare earth metal-containing second metal film 126, e.g., Er film, on the first metal semiconductor compound 124.

Figure 24:
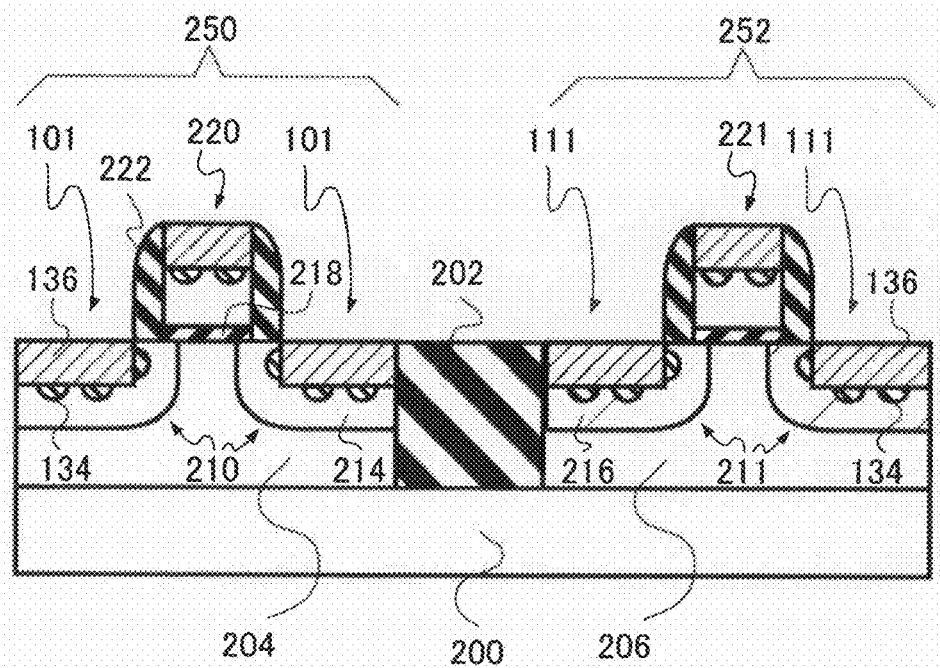

Next as shown in FIG. 24, perform second-time thermal processing by known single wafer RTP equipment in an inert gas atmosphere. A thermal processing temperature in this case is an appropriate temperature selected in accordance with the kind of the rare earth metal used. This second thermal processing causes the Er film that is the second metal film 126 (FIG. 23) and the NiSi that is the first metal semiconductor compound 124 (FIG. 23) to react together to thereby form a rare earth metal-containing second metal semiconductor compound 136—here, Er-containing NiSi film. Simultaneously, let Ni in the first metal semiconductor compound 124 (FIG. 23) react with Si in the n-type source/drain diffusion layers 214 and p-type source/drain diffusion layers 216 to thereby form a cluster-shaped NiSi that is a third metal semiconductor compound 134 at interfaces between the n-type source/drain diffusion layers 214 and p-type source/drain diffusion layers 216. Then, selectively remove unreacted portions of the Er film that is the second metal film 126 (FIG. 23) by known wet etching or the like.

According to the semiconductor device fabrication method of this embodiment, both the conductor less in contact resistance for electrons and the conductor less in contact resistance for holes are in contact with the semiconductor on the substrate, it becomes possible to realize a semiconductor device having source and drain electrodes that are less in contact resistance both for electrons and for holes. Accordingly, it is no longer required to prepare different electrode materials for the electron use and for the hole use. Thus, the semiconductor device fabrication method of this embodiment avoids the need for separate formation of the source and drain electrodes of nMISFET and the source/drain electrodes of pMISFET. This results in noticeable simplification of manufacturing processes of the semiconductor device, which advantageously contributes to improvement of production yields, shortening of mass-production period, and manufacturing cost reduction.

In this embodiment, as in the first embodiment, the first metal film is preferably a metal film that contains therein nickel (Ni) or platinum (Pt).

Additionally the semiconductor device fabrication method of this embodiment is similar to the first embodiment in that in case the semiconductor substrate is Si with the first metal film being Ni film and the second metal film being Er or Y film, it is preferable to design the second metal film in such a way as to have its thickness which is greater than or equal to 10% of the thickness of first metal semiconductor compound and yet less than 100% of the same.

Third Embodiment

A semiconductor device in accordance with a third embodiment of this invention is similar to the semiconductor device of the second embodiment except that the semiconductor substrate is made of silicon (Si), that the source and drain semiconductor regions of nMISFET is made of $Si_xC_{1-x}$ (0<x<1), and that the source and drain semiconductor regions of pMISFET being made of $Si_xGe_{1-x}$ (0<x≦1).

Figure 25:
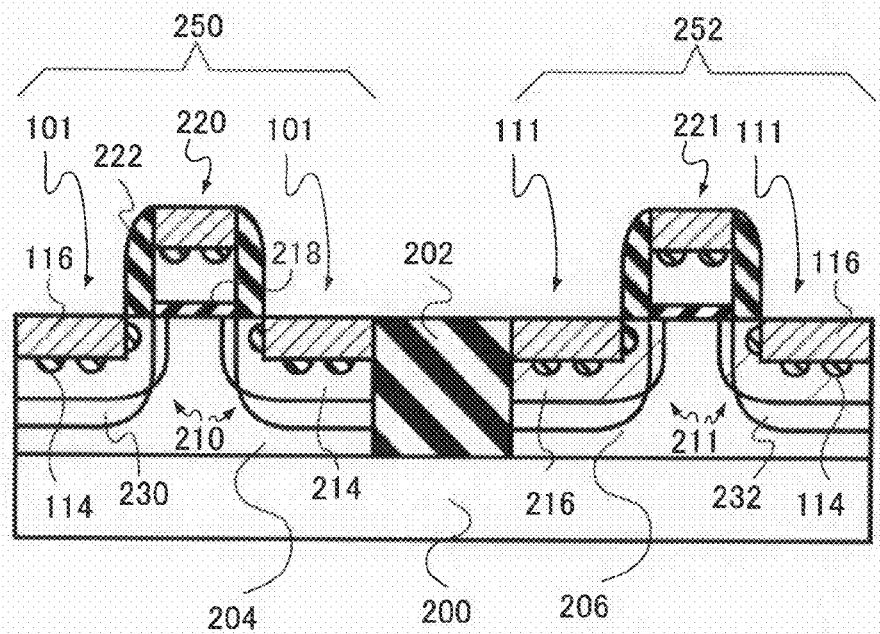
FIG. 25 is a diagram showing a sectional view of a semiconductor device in accordance with still another embodiment of the invention.

FIG. 25 is a sectional diagram showing a device structure of the semiconductor device in accordance with the third embodiment of the invention. The semiconductor device of this embodiment is arranged so that an n-channel type MISFET 250 and a p-type MISFET 252 are formed on a semiconductor substrate 200 made of p-type silicon. The nMISFET 250 has its source and drain semiconductor regions 210 made of $Si_xC_{1-x}$ (0<x<1) 230. The pMISFET 252 has its source and drain semiconductor regions 211 made of $Si_xGe_{1-x}$ (0<x<1) 232. Except that the source and drain regions of nMISFET and pMISFET are made of materials different from that of the semiconductor substrate in this way, the device structure of FIG. 25 is similar to the semiconductor device of the second embodiment.

According to this embodiment, when looking at the nMISFET, a tensile strain is created at a channel portion due to a difference in lattice constant between the Si that forms a channel portion of this MISFET and the $Si_xC_{1-x}$ (0<x<1) 230 that forms the source and drain semiconductor regions 210. Due to this, the carrier mobility of electrons at the channel is improved. Alternatively, when looking at the pMISFET, a compressive strain is generated at a channel portion due to a difference in lattice constant between the Si that forms a channel portion of this MISFET and the $Si_xGe_{1-x}$ (0<x<1) 232 that forms the source and drain semiconductor regions 211. This results in improvement of the carrier mobility of holes.

By the improvements of channel mobilities of electron and hole in this way, the channel resistance decreases.

Accordingly, the influenceability of the contact resistance at source and drain electrodes with respective to MISFET characteristics increases appreciably. Thus, by lowering the source/drain electrodes in electrical resistance in this embodiment, the MISFET characteristics are further improved, thereby enabling achievement of a semiconductor device having much higher performance.

Note that in the $Si_xGe_{1-x}$ of this embodiment, the ratio of Ge is preferably set to about 30 atomic percent (at %), i.e., x=0.7 or more or less, from the viewpoints of mobility improvement and suppression of crystal defects otherwise occurring due to possible lattice mismatch. Additionally, in the $Si_xC_{1-x}$ of this embodiment, the ratio of C is preferably set at about several at % from a viewpoint of mobility improvement. In other words, the suffix "x" is preferably set to $0.1 \leq x < 1$.

Also note that although there is described herein one specific form in which the semiconductor material of the source and drain semiconductor regions of the nMISFET and pMISFET is arranged by a semiconductor that is different from Si, similar results as to the improvement of semiconductor device characteristics are obtainable by designing the semiconductor material of either one of the source semiconductor region and drain semiconductor region to be a semiconductor which is different from Si.

While this embodiment is arranged to employ as one form for applying distortion or strain to MISFET channels the design scheme which uses the semiconductor substrate is made of Si and the source/drain semiconductor regions of nMISFET are comprised of $Si_xC_{1-x}$ (0<x<1) and the source/drain semiconductor regions of pMISFET are made of $Si_xGe_{1-x}$ (0<x<1), any other similar suitable semiconductor materials may be selected and used therefor as far as these are combinations of those semiconductor materials which improve the carrier mobility by application of strain to the semiconductor of channel portions.

Additionally, as the semiconductor device fabrication method of this embodiment, in the semiconductor device fabrication method of this embodiment of the second embodiment for example, after having formed the sidewall dielectric films 222 shown in FIG. 19, certain semiconductor substrate portions which become the source and drain semiconductor regions are etched by known RIE techniques with the gate electrodes 220-221 and sidewall dielectric films 222 being as a mask therefor, and then these regions are filled with $Si_xC_{1-x}$ and $Si_xGe_{1-x}$ as buried therein by known epitaxial growth techniques. And, thereafter, a similar method to that of the second embodiment is used whereby the semiconductor device of this embodiment becomes manufacturable.

Fourth Embodiment

A semiconductor device of a fourth embodiment of this invention is similar to the semiconductor device of the second embodiment expect that the nMISFET's source and drain semiconductor regions are made of a p-type semiconductor material whereas the pMISFET's source/drain semiconductor regions are comprised of an n-type semiconductor.

Figure 26:
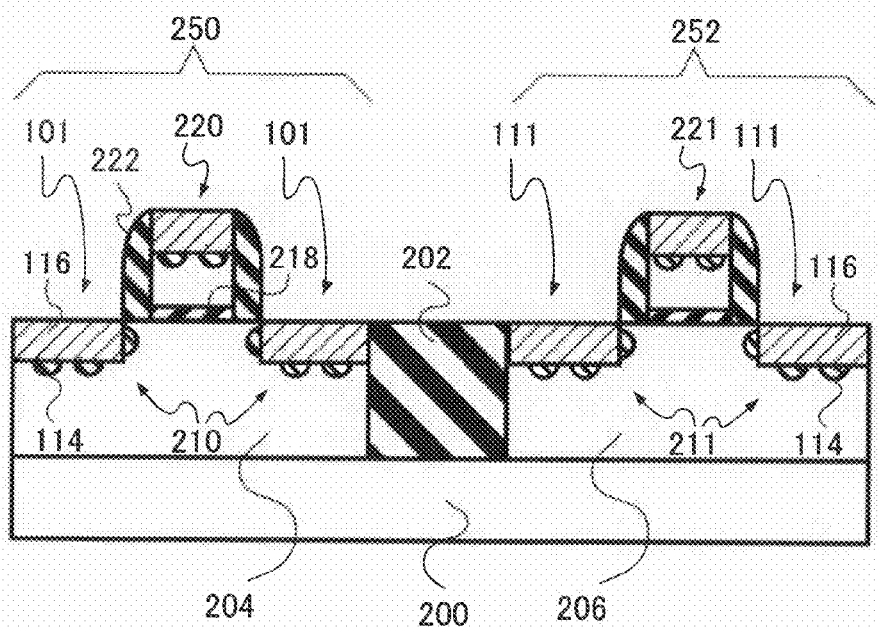
FIG. 26 is a diagram showing a sectional view of a semiconductor device in accordance with a further embodiment of the invention.

FIG. 26 is a sectional diagram showing a device structure of the semiconductor device of the fourth embodiment of the invention. The semiconductor device of this embodiment is arranged so that the source and drain semiconductor regions 204 of nMISFET 250 are made of a p-type semiconductor which is the same in conductivity type as a p-type well that is the first semiconductor region 204. More specifically, unlike the second embodiment, none of the $n^+$-type source and drain regions 214 are formed. In addition, the pMISFET 252's source and drain semiconductor regions 211 are made of an n-type semiconductor which is the same in conductivity type as an n-type well that is the second semiconductor region 206. In other words, unlike the second embodiment, none of the $p^+$-type source and drain regions 216 are formed. In this way, in this embodiment, the nMISFET 250 and pMISFET 252 become the so-called Schottky transistors.

In prior known Schottky transistors, short channel effects are suppressible because of the absence of source/drain diffusion layers. However, such transistors have suffered from a problem as to electrical contact resistance due to the presence of Schottky barriers to be formed at interfaces between substrate semiconductor and electrodes made of metals or metal silicides.

According to the semiconductor device of this embodiment, both the nMISFET with electrons as its carriers and the pMISFET with holes as its carriers, which are the same in electrode structure as each other, are reduced in parasitic resistance owing to the functions and advantages which have been explained in detail in the first and second embodiments. Thus it becomes possible to realize a high-performance semiconductor device having parasitic resistance-lowered Schottky transistors while at the same time suppressing short channel effects.

Although one specific form was described herein which employs the nMISFET and pMISFET as the Schottky transistors, it is still possible to attain the improved semiconductor device characteristics by designing either one of the MISFETs to be Schottky junction transistor, and this approach is also interpreted to be included within the scope of this invention.

Additionally, the semiconductor device of this embodiment is also manufacturable, in the semiconductor device fabrication method of the second embodiment, for example, by elimination of the n-type source and drain regions 214 and the p-type source and drain regions 216 shown in FIG. 20.

Fifth Embodiment

A semiconductor device of a fifth embodiment is different from the fourth embodiment in that the n-type impurity concentration at the interface between the source/drain semiconductor region of nMISFET and the metal-containing second conductor of nMISFET is set to fall within a range of from $8 \times 10^{19}$ atoms/cm$^3$ to $5 \times 10^{20}$ atoms/cm$^3$ and in that the n-type impurity concentration at a depth of 20 nm from the interface is less than or equal to $\frac{1}{10}$ of the n-type impurity concentration at the interface. In addition, this embodiment device is different from the fourth embodiment in that the p-type impurity concentration at the interface between the source/drain semiconductor region of pMISFET and the metal-containing second conductor of pMISFET is set to range from $8 \times 10^{19}$ atoms/cm$^3$ to $5 \times 10^{20}$ atoms/cm$^3$ and in that the p-type impurity concentration at a depth of 20 nm from the interface is less than or equal to $\frac{1}{10}$ of the p-type impurity concentration at the interface. Except these differences, this embodiment device is similar to the fourth embodiment.

Figure 27:
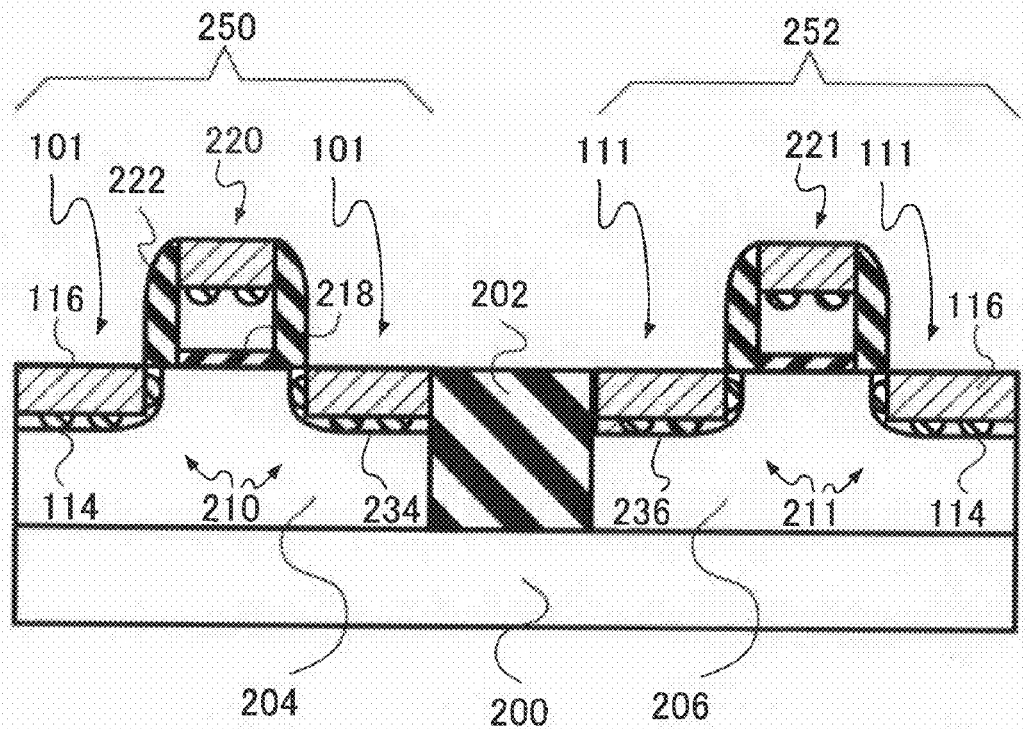
FIG. 27 is a diagram showing a sectional view of a semiconductor device in accordance with another further embodiment of the invention.

FIG. 27 is a sectional diagram showing an element structure of the semiconductor device in accordance with the fifth embodiment of this invention. The semiconductor device of this embodiment is arranged so that the concentration of an n-type impurity, e.g., As or else, at the interface between the source/drain semiconductor region 210 of nMISFET 250 and the rare earth metal-containing second conductor 116 of nMISFET 250 is set to range from $8 \times 10^{19}$ atoms/cm$^3$ to $5 \times 10^{20}$ atoms/cm$^3$, while having an n-type impurity segregation layer 234, wherein the n-type impurity concentration at a depth of 20 nm from the interface is less than or equal to $\frac{1}{10}$ of the n-type impurity concentration at the interface. Additionally this embodiment device is arranged so that the concentration of a p-type impurity, such as B, at the interface between the source/drain semiconductor region 211 of pMISFET 252 and the rare earth metal-containing second conductor 116 of pMISFET 252 ranges from $8 \times 10^{19}$ to $5 \times 10^{20}$ atoms/cm$^3$, while having a p-type impurity segregation layer 236, wherein the p-type impurity concentration at a depth of 20 nm from the interface is less than or equal to $\frac{1}{10}$ the p-type impurity concentration at the interface. In this way, the nMISFET 250 and pMISFET 252 in this embodiment are each arranged to be the so-called dopant-segregated Schottky transistor having a heavily-doped impurity segregation layer at the individual source/drain electrode interface.

The dopant-segregated Schottky transistor has at its electrode interface the heavily-doped impurity segregation layer with a reduced thickness whereby it reduces short channel effects and, at the same time, lowers the height of effective Schottky barrier to thereby reduce parasitic resistance of the electrodes involved.

According to the semiconductor device of this embodiment, both the nMISFET with electrons as its carriers and the pMISFET with holes as its carriers, which are the same in electrode structure as each other, are reduced in parasitic resistance owing to the functions and advantages which have been explained in detail in the first and second embodiments. Thus it becomes possible to realize a high-performance semiconductor device having parasitic resistance-lowered impurity-segregation Schottky transistors while further suppressing or minimizing short channel effects.

The reason for determination of the impurity distribution of the impurity segregation layer 234, 236 in the above-stated way is that if the setup value is lower than the above-noted impurity concentration range of the interface then it is no longer expectable to sufficiently lower the effective Schottky barrier height. In addition, when the depth at which the at-interface impurity concentration becomes $\frac{1}{10}$ or less becomes deeper than 20 nm, risks as to deterioration of characteristics can be raised due to the presence of parasitic resistance of the impurity segregation layer per se and the occurrence of short channel effects.

While one specific form was described herein which employs the nMISFET and pMISFET as the dopant-segregated Schottky transistors, it is still possible to attain the improved semiconductor device characteristics by designing either one of the MISFETs to be dopant-segregated Schottky junction transistor: this approach is also interpreted to fall within the scope of this invention.

An explanation will next be given of a method of fabricating the semiconductor device of this embodiment. Note here that the procedure up to the step of FIG. 19 in the semiconductor device fabrication method of the second embodiment is similarly performed in this embodiment method also. Thereafter, at the step of FIG. 20, when known lithography and ion implantation methods are used to introduce an As impurity into the first semiconductor region 204 to thereby form the n-type source and drain semiconductor regions 214, As is doped with a dosage of $2 \times 10^{15}$ atoms/cm$^2$ or more, by known low acceleration ion implantation methods with an acceleration voltage being set to about 2 KeV or below. The implantation conditions at this step are set to ensure that the intended p-n junction is formed at a specific position which is shallower than the thickness of a first metal semiconductor compound 124 (see FIG. 22) to be later formed. Similar setup is done when doping B impurity into second semiconductor region 206 to thereby form p-type source and drain semiconductor regions 216. The following procedure is similar to that of the semiconductor device fabrication method of this second embodiment.

In prior art fabrication methods of dopant-segregated Schottky transistors, it has been difficult to form an impurity segregation layer in MISFETs, especially in pMISFETs. This difficulty is due to the fact that one typical impurity used to form p-type diffusion layers, e.g., B, has its nature of being readily absorbed in metal silicides during formation of metal silicides, such as NiSi or else. In accordance with the semiconductor device fabrication method of this embodiment, it becomes possible to fabricate a semiconductor device having, as its pMISFETs, impurity-segregated Schottky transistors with B as the impurity thereof.

An explanation will be given of a process for the formation of an impurity segregation layer doped with B impurity in accordance with the semiconductor device fabrication method of this embodiment, with reference to FIGS. 28A to 28D. The explanation below is under an assumption that the semiconductor substrate is made of Si, the first metal film is comprised of Ni, and the second metal film is made of Er.

Figure 28A:
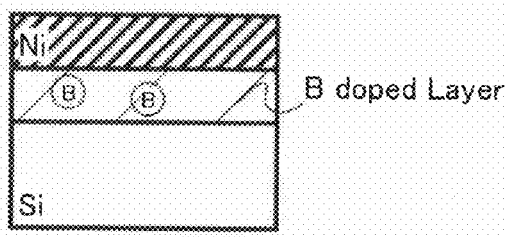
FIGS. 28A-28D are diagrams for explanation of effects of a fabrication method of the semiconductor device of FIG. 27.

FIG. 28A is an enlarged sectional diagram of a part consisting of the semiconductor substrate and first metal film 122 at the step of FIG. 21. The semiconductor substrate used here is made of Si whereas the first metal film is made of Ni. At the interface between Ni of the first metal film and Si of substrate, a heavily B-doped thin-film layer is formed.

Figure 28B:
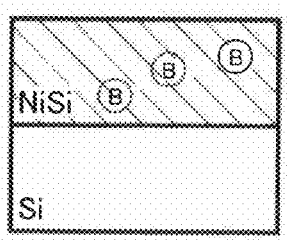

The structure of FIG. 28A is subjected to first-time thermal processing. By this thermal processing, as shown in FIG. 28B, a layer of NiSi that is the first metal semiconductor compound 134 is formed to cover a region which is deeper than the B-doped layer. At this time, most B atoms are absorbed by the NiSi film side.

Figure 28C:
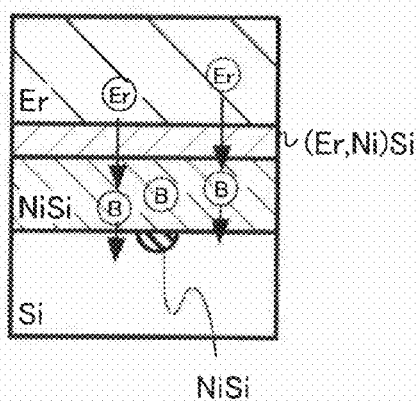

Next, as shown in FIG. 28C, second-time thermal processing is performed after having deposited an Er film that is the second metal film. This thermal processing results in that Er is diffused to the NiSi side whereas Si is diffused to the Er film side, resulting in solid-state reaction. By this reaction, Si reacts with Er, causing Er to be replaced by Ni which is a portion of NiSi. This results in formation of NiSi which contains Er that is the second metal semiconductor compound—i.e., (Er,Ni)Si. At this time, B atoms which have been distributed in the NiSi that is the first metal semiconductor compound are pushed out toward the Si side by Er atoms that are large in radius. Any residual Ni after replacement with Er behaves to react with Si on the substrate side for silicidation again or "re-silicidation," resulting in segregation at the Si interface to thereby form clusters. This NiSi corresponds to the above-stated third metal semiconductor compound.

Figure 28D:
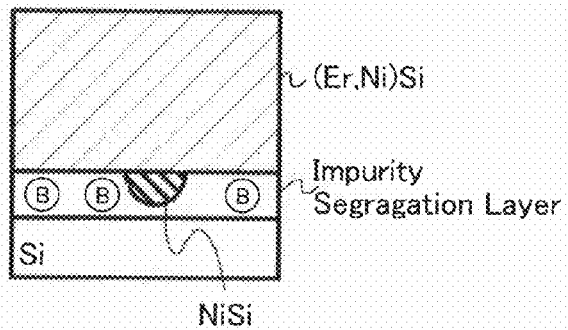

As shown in FIG. 28D, a NiSi cluster is present on the Si side. However, the NiSi cluster covers only part of the interface with the electrode. Thus many B atoms reside on the Si side of the interface. A layer of B impurity segregation is thus formed on the Si side of the interface with the electrode.

The atom behavior in this fabrication example is principally based on the mechanism that the rare earth metal of large atomic radius pushes out B atoms in metal silicide toward the Si side. In this sense, similar results are obtainable even when using rare earth metals other than Er and Y and metals different from Ni, such as Pt.

While the invention has been described with reference to specific embodiments, the description is illustrative of the invention and is not to be construed as limiting the invention. Additionally, although, in the above description of the semiconductor devices and fabrication methods thereof, detailed explanations are eliminated as to parts or process steps other than those which are deemed not directly relevant to the subject matter of the principles of this invention, any available elements concerning the required semiconductor device and its fabrication methodology may be selectable and employable on a case-by-case basis.

Although in the illustrative embodiments the semiconductor substrate is made of silicon (Si), this substrate is replaceable by a semiconductor substrate made of other semiconductive materials, including but not limited to $Si_xGe_{1-x}$ ($0 \leq x < 1$), SiC, GaN, GaAs, and InP. In this case also, similar advantages are obtainable.

Other possible semiconductor devices and semiconductor device fabrication methods which comprise the subject matter of this invention and which are modifiable and alterable through design activities by those skilled in the art on a case-by-case basis should be interpreted to be included within the coverage of the invention. The invention is, therefore, to be defined only as indicated by the scope of the appended claims and scopes of equivalents thereto.

What is claimed is:

1. A semiconductor device comprising:
   a semiconductor substrate having a surface with an n-type diffusion layer and a p-type diffusion layer being formed therein;
   a first metal wire overlying the n-type diffusion layer with a dielectric layer being interposed therebetween;
   a second metal wire overlying the p-type diffusion layer with the dielectric layer interposed therebetween;
   a first contact electrode extending through a first opening of the dielectric layer for electrical connection between the n-type diffusion layer and the first metal wire; and
   a second contact electrode extending through a second opening of the dielectric layer for electrical connection between the p-type diffusion layer and the second metal wire,
   wherein the first contact electrode includes a first contacting portion in contact with the n-type diffusion layer, and
   the second contact electrode includes a second contacting portion in contact with the p-type diffusion layer, and
   each of said first and second contacting portions is formed of a first conductive material region and a second conductive material region wherein the first conductive material region contains a metal semiconductor compound, and said second conductive material region contains a rare earth metal semiconductor compound different from the metal semiconductor compound of the first conductive material region; and
   wherein the first second conductive material regions of the first contacting portion are both in direct contact with the n-type diffusion layer, and
   the first and second conductive material regions of the second contacting portion are both in direct contact with the p-type diffusion layer; and
   the first conductive material region of each of said first and second contacting portions, formed directly under the second conductive material region, has particles, and
   each of the n-type diffusion layer and the p-type diffusion layer has the first and second conductive material regions formed therein.

2. The semiconductor device according to claim 1, wherein a Schottky barrier for carrier holes between the first conductive material region of the second contacting portion and the p-type diffusion layer is less than or equal to 0.50 electronvolts (eV) in height, and a Schottky barrier for electrons between the second conductive material region of the first contacting portion and n-type diffusion layer is less than or equal to 0.50 eV in height.

3. The device according to claim 1, wherein the first conductive material region in said each of said first and second contacting portions comprised of a metal silicide containing therein any one of nickel (Ni) and platinum (Pt).

* * * * *